(12) United States Patent
Maeda et al.

(10) Patent No.: US 9,093,306 B2
(45) Date of Patent: *Jul. 28, 2015

(54) LOW NOISE AND HIGH PERFORMANCE LSI DEVICE

(71) Applicant: Samsung Electronics Co., Ltd., Suwon-si (KR)

(72) Inventors: Shigenobu Maeda, Seongnam-Si (KR); Jeong Hwan Yang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/337,532

(22) Filed: Jul. 22, 2014

(65) Prior Publication Data

US 2014/0332897 A1 Nov. 13, 2014

Related U.S. Application Data

(60) Division of application No. 12/984,261, filed on Jan. 4, 2011, now Pat. No. 8,816,440, which is a continuation of application No. 11/981,153, filed on Oct. 31, 2007, now Pat. No. 7,964,454, which is a division of application No. 11/067,836, filed on Feb. 28, 2005, now Pat. No. 7,545,002.

(30) Foreign Application Priority Data

Mar. 30, 2004 (KR) .................. 10-2004-0021569

(51) Int. Cl.
*H01L 29/94* (2006.01)
*H01L 29/76* (2006.01)
(Continued)

(52) U.S. Cl.
CPC ...... *H01L 27/092* (2013.01); *H01L 21/823412* (2013.01); *H01L 21/823418* (2013.01);
(Continued)

(58) Field of Classification Search
CPC ... H01L 27/092; H01L 27/11; H01L 27/1052; H01L 27/1104; H01L 29/7843; H01L 29/7845; H01L 29/7848; H01L 29/665

USPC .............. 257/365, 368, 369, 374, 640, 669, 257/E27.062, E27.067, E21.633, E21.635; 438/119, 197, 199
See application file for complete search history.

(56) References Cited

U.S. PATENT DOCUMENTS 6,461,928 B2 10/2002 Rodder
6,573,172 B1 6/2003 En et al.
(Continued)

FOREIGN PATENT DOCUMENTS

CN 1445838 10/2003
CN 1638126 7/2005
(Continued)

OTHER PUBLICATIONS

Japanese Office Action Corresponding to Japanese Patent Application No. 2005-099739; Dated: Jan. 4, 2012, Japanese Text Only, 2 pages.
(Continued)

*Primary Examiner* — Dao H Nguyen
(74) *Attorney, Agent, or Firm* — Myers Bigel Sibley & Sajovec, P.A.

(57) ABSTRACT

In semiconductor devices in which both NMOS devices and PMOS devices are used to perform in different modes such as analog and digital modes, stress engineering is selectively applied to particular devices depending on their required operational modes. That is, the appropriate mechanical stress, i.e., tensile or compressive, can be applied to and/or removed from devices, i.e., NMOS and/or PMOS devices, based not only on their conductivity type, i.e., n-type or p-type, but also on their intended operational application, for example, analog/digital, low-voltage/high-voltage, high-speed/low-speed, noise-sensitive/noise-insensitive, etc. The result is that performance of individual devices is optimized based on the mode in which they operate. For example, mechanical stress can be applied to devices that operate in high-speed digital settings, while devices that operate in analog or RF signal settings, in which electrical noise such as flicker noise that may be introduced by applied stress may degrade performance, have no stress applied.

15 Claims, 31 Drawing Sheets

(51) Int. Cl.
*H01L 27/092* (2006.01)
*H01L 21/8234* (2006.01)
*H01L 21/8238* (2006.01)
*H01L 27/105* (2006.01)
*H01L 29/66* (2006.01)
*H01L 29/78* (2006.01)

(52) U.S. Cl.
CPC *H01L21/823807* (2013.01); *H01L 21/823814* (2013.01); *H01L 27/1052* (2013.01); *H01L 29/7843* (2013.01); *H01L 29/7845* (2013.01); *H01L 29/7848* (2013.01); *H01L 29/665* (2013.01); *H01L 29/7833* (2013.01)

(56) References Cited

U.S. PATENT DOCUMENTS

| | | | |
|---|---|---|---|
| 6,906,393 | B2 | 6/2005 | Sayama et al. |
| 6,939,814 | B2 | 9/2005 | Chan et al. |
| 6,982,465 | B2 | 1/2006 | Kumagai et al. |
| 7,078,742 | B2 | 7/2006 | Lin et al. |
| 7,101,742 | B2 | 9/2006 | Ko et al. |
| 7,105,394 | B2 | 9/2006 | Hachimine et al. |
| 7,115,954 | B2 | 10/2006 | Shimizu et al. |
| 7,176,522 | B2 | 2/2007 | Cheng et al. |
| 7,470,618 | B2 | 12/2008 | Sayama et al. |
| 7,518,193 | B2 * | 4/2009 | Anderson et al. .............. 257/369 |
| 7,545,001 | B2 | 6/2009 | Cheng et al. |
| 7,545,002 | B2 * | 6/2009 | Maeda et al. ................. 257/368 |
| 7,808,049 | B2 * | 10/2010 | Kotani .......................... 257/365 |
| 7,960,281 | B2 | 6/2011 | Sayama et al. |
| 2003/0040158 | A1 | 2/2003 | Saitoh |
| 2003/0181005 | A1 | 9/2003 | Hachimine et al. |
| 2004/0075148 | A1 | 4/2004 | Kumagai et al. |
| 2004/0097030 | A1 | 5/2004 | Sayama et al. |
| 2005/0035470 | A1 | 2/2005 | Ko et al. |
| 2005/0112817 | A1 | 5/2005 | Cheng et al. |
| 2005/0151163 | A1 | 7/2005 | Hiyama et al. |
| 2005/0186722 | A1 | 8/2005 | Cheng et al. |
| 2005/0218455 | A1 | 10/2005 | Maeda et al. |
| 2007/0085151 | A1 * | 4/2007 | Kotani .......................... 257/393 |
| 2007/0290208 | A1 | 12/2007 | Hiyama et al. |
| 2008/0064157 | A1 | 3/2008 | Maeda et al. |
| 2008/0099786 | A1 | 5/2008 | Maeda et al. |
| 2009/0081843 | A1 | 3/2009 | Sayama et al. |
| 2011/0147852 | A1 * | 6/2011 | Maeda et al. ................. 257/369 |
| 2011/0207312 | A1 | 8/2011 | Sayama et al. |

FOREIGN PATENT DOCUMENTS

| | | |
|---|---|---|
| JP | 62-013061 | 1/1987 |
| JP | 07-169838 | 7/1995 |
| JP | 11-238799 | 8/1999 |
| JP | 2000-216377 | 8/2000 |
| JP | 2001-250916 | 9/2001 |
| JP | 2001-257351 | 9/2001 |
| JP | 2001-332706 | 11/2001 |
| JP | 2002-368080 | 12/2002 |
| JP | 2003-086708 | 3/2003 |
| JP | 2003-092409 | 3/2003 |
| JP | 2004-095903 | 3/2004 |
| JP | 2004-172389 | 6/2004 |
| KR | 10-2003-0082934 | 10/2003 |

OTHER PUBLICATIONS

First Office Action dated Aug. 2, 2011 issued in corresponding Japanese Patent Application No. 2005-099739.

Ota et al. "Novel Locally Strained Channel Technique for High Performance 55nm CMOS," Tech. Dig. IEDM, pp. 27-30, 2002.

"Low Noise and High Performance LSI Device, Layout and Manufacturing Method" Specification, Drawings and Prosecution History, of U.S. Appl. No. 11/067,836, filed Feb. 28, 2005, now U.S. Patent No. 7,545,002, issued Jun. 9, 2009, by Shigenobu Maeda et al., which is stored in the U.S. Patent and Trademark Office (USPTO).

"Low Noise and High Performance LSI Device, Layout and Manufacturing Method" Specification, Drawings and Prosecution History, of U.S. Appl. No. 11/981,153, filed Oct. 31, 2007, now U.S. Patent No. 7,964,454, issued Jun. 21, 2011, by Shigenobu Maeda et al., which is stored in the U.S. Patent and Trademark Office (USPTO).

"Low Noise and High Performance LSI Device, Layout and Manufacturing Method" Specification, Drawings and Prosecution History, of U.S. Appl. No. 12/004,290, filed Dec. 20, 2007, now U.S. Patent No. 7,956,420, issued Jun. 7, 2011, by Shigenobu Maeda et al., which is stored in the U.S. Patent and Trademark Office (USPTO).

* cited by examiner

LOW NOISE AND HIGH PERFORMANCE LSI DEVICE

RELATED APPLICATIONS

This application is a divisional application of U.S. patent application Ser. No. 12/984,261, filed Jan. 4, 2011, now U.S. Pat. No. 8,816,440, which is a continuation application of U.S. patent application Ser. No. 11/981,153, filed on Oct. 31, 2007, now U.S. Pat. No. 7,964,454, which is a divisional of U.S. patent application Ser. No. 11/067,836, filed on Feb. 28, 2005, now U.S. Pat. No. 7,545,002, which claims the benefit of Korean Patent Application No. 2004-0021569, filed in the Korean Intellectual Property Office on Mar. 30, 2004, the contents of all of which are hereby incorporated herein in their entireties by reference.

FIELD

The invention is directed to semiconductor devices and, more particularly, to Large Scale Integration (LSI) semiconductor devices, such as metal-oxide-silicon (MOS) transistors in which mechanical stress engineering is employed to improve device performance.

BACKGROUND

The carrier mobility in a MOS transistor has a significant impact on power consumption and switching performance of the device. Improvement in carrier mobility allows faster switching speed and allows for operation at low voltages, resulting in reduced power consumption.

Mechanical stress engineering has been employed in MOS transistors to improve carrier mobility. Tensile stress on a channel region causes increased current in an NMOS transistor but causes decreased current in a PMOS transistor. Compressive stress on the channel region causes increased current in a PMOS transistor but causes decreased current in an NMOS transistor.

FIG. 1 is a schematic cross-sectional view of a MOS device illustrating an approach to introducing mechanical stress to improve carrier mobility in the device. The device is formed in a substrate 10 and is isolated by isolation regions 12 formed in the substrate 10. The transistor device includes source/drain regions 22, 26 formed in the substrate 10 defining a channel region 18 therebetween. A gate structure includes a gate dielectric 14 formed on the substrate 10, a conductive gate layer 20 over the gate dielectric and a silicide layer 30 formed over the conductive gate layer 20. Insulating sidewall spacers 24 are formed on the sidewalls of the gate structure.

Mechanical stress is introduced into the channel 18 by a stress control layer 40 formed over the gate structure and the top surface of the source/drain regions 26 and substrate 10. Specifically, tensile stress is introduced into the MOS transistor structure as indicated by the arrows in the figure. Another approach to introducing tensile stress into the channel 18, as illustrated by the arrows in FIG. 1, is the silicide layer 30 formed in the source/drain regions 22, 26. After silicidation, the silicide regions 30 occupy less volume than the original source/drain material replaced by the silicide. As a result, tensile stress is introduced into the channel 18.

In addition to the improvement in carrier mobility, the introduction of mechanical stress into a MOS transistor has also been shown to degrade the performance of the device by introducing electrical noise, specifically, flicker noise. Flicker noise, also commonly referred to as "1/f noise," is a type of noise whose power spectrum P(f) as a function of frequency f behaves in accordance with $P(f)=1/f^a$, where a is very close to 1. Flicker noise is also commonly referred to as "pink noise" because most of the noise power is concentrated at the lower end of the frequency spectrum. Flicker noise is considered to be caused not only by the trapping and detrapping of carriers, but also by mobility modulation via carrier scattering due to the trapped charges. Flicker noise degradation can be an important factor for both low frequency analog circuits and high performance digital circuits. Although the flicker noise is generated at relatively low frequencies, the noise may be very significant to some RF circuits since it is up-converted to the high frequency spectrum and degrades the coherency of oscillation.

FIGS. 2A and 2B are graphs illustrating the relationship between stress engineering in a MOS device and noise. FIG. 2A is a graph of the noise power Svg distribution between stress-enhanced and stress-attenuated transistors. The measurements are taken at Vd=0.05V and Vg=0.85V for an NMOS device, and Vd=−0.05V and Vg=−0.85V for a PMOS device. FIG. 2B is a graph of Noise Power Ratio versus maximum transconductance (Gmmax) improvement ratio of a CMOS device. The graph of FIG. 2B illustrates that both tensile and compressive stress on a MOS device degrade performance from the standpoint of flicker noise.

Hence, enhanced stress engineering applied to MOS devices improves performance of MOS transistors but degrades flicker noise characteristics. That is, in both NMOS and PMOS devices, both tensile stress and compressive stress enhance performance of the devices but degrade the flicker noise characteristics of both devices. Therefore, stress engineering is not always an acceptable means for improving overall circuit performance, when flicker noise characteristics are considered, such as, in particular, in analog applications, RF applications and mixed-signal applications, e.g., system LSI applications.

SUMMARY

It is a feature of the invention to provide a semiconductor device such as an LSI device having mixed-signal applications, a layout of the semiconductor device and an approach to manufacturing the device, in which tensile and/or compressive stress are selectively applied to different portions of the device, i.e., analog and digital portions, to enhance performance of the device and simultaneously reduce the effects of flicker noise on the performance of the device.

In one aspect, the invention is directed to a method of fabricating a circuit. A plurality of devices of a plurality of conductivity types are formed in a plurality of regions of the circuit, the plurality of devices being adapted to perform in a plurality of associated operational modes. A mechanical stress is applied to at least one selected device, the selected device being selected based on its associated operational mode.

The operational modes can include an analog mode and a digital mode. The operational modes can also include a noise-sensitive mode and a noise-insensitive mode, a low-speed operation mode and a high-speed operation mode, and a high-voltage operation mode and a low-voltage operation mode.

In one embodiment, the devices comprise at least one PMOS device and/or one NMOS device. The devices can include at least one CMOS device.

In one embodiment, mechanical stress is applied to a channel of an NMOS device in the digital mode. In one embodiment, mechanical stress is applied to the channel of a PMOS device in the digital mode.

In one embodiment, stress is not applied to a device operating in an analog mode to prevent an increase in electrical noise. The electrical noise can be flicker noise.

In one embodiment, applying a mechanical stress to at least one selected device comprises forming a stress control layer on the circuit in proximity to the devices. The stress control layer can apply a tensile stress and/or a compressive stress. In one embodiment, stress is release in the stress control layer in proximity to devices to which stress is not to be applied. Releasing the stress in the stress control layer can include implanting ions into the stress control layer. Releasing the stress in the stress control layer can include selectively removing portions of the stress control layer. The stress control layer can include SiN, SiON or $SiO_2$. Forming the stress control layer can include an annealing step. Forming the stress control layer can include performing plasma-enhanced chemical vapor deposition (PECVD) and/or low-pressure chemical vapor deposition (LPCVD).

In one embodiment, applying a mechanical stress to at least one selected device comprises performing a silicidation process on the circuit. In one embodiment, applying a mechanical stress to at least one selected device further comprises: forming a capping layer on the circuit; selectively removing the capping layer in proximity to devices to which stress is to be applied; and performing a second silicidation process to apply stress to the devices to which stress is to be applied.

In one embodiment, applying a mechanical stress to at least one selected device comprises epitaxially growing a source/drain structure in a device to which stress is to be applied.

In one embodiment, stress is applied to a first device in a first CMOS structure and to a second device in the first CMOS structure; and stress is not applied to a first device in a second CMOS structure and to a second device in the second CMOS structure. In one embodiment, the first CMOS structure operates in a digital mode and the second CMOS structure operates in an analog mode. In one embodiment, the first device in the first CMOS structure is a PMOS device; the second device in the first CMOS structure is an NMOS device; the PMOS device has a compressive stress applied to its channel; and the NMOS device has a tensile stress applied to its channel. In one embodiment, the first device in both the first CMOS structure and the second CMOS structure is a PMOS device. In one embodiment, the second device in both the first CMOS structure and the second CMOS structure is an NMOS device.

In one embodiment, applying the mechanical stress comprises: forming a first stress control layer on the circuit, the stress control layer applying a tensile stress on the devices; selectively removing the first stress control layer in proximity to devices that do not require tensile stress; forming a second stress control layer on the devices, the second stress control layer applying a compressive stress on the devices; forming a stress release layer over the second stress control layer in proximity to a selected portion of the devices; and using the stress release layer, releasing stress in devices that do not require the compressive stress. Releasing stress in devices that do not require the compressive stress can include implanting ions into the stress release layer.

In one embodiment, applying the mechanical stress comprises: forming a first stress control layer on the circuit, the stress control layer applying a tensile stress on the devices; selectively removing the first stress control layer in proximity to devices that do not require tensile stress; forming a second stress control layer on the devices, the second stress control layer applying a compressive stress on the devices; and selectively removing the second stress control layer in proximity to devices that do not require the compressive stress.

According to another aspect, the invention is directed to a circuit. The circuit includes a substrate on which are formed a plurality of devices of a plurality of conductivity types in a plurality of regions of the circuit, the plurality of devices being adapted to perform in a plurality of operational modes. At least one selected device among the plurality of devices has a mechanical stress applied thereto, the selected device being selected based on its operational mode.

The operational modes can include an analog mode and a digital mode. The operational modes can also include a noise-sensitive mode and a noise-insensitive mode, a low-speed operation mode and a high-speed operation mode, and a high-voltage operation mode and a low-voltage operation mode.

In one embodiment, the devices comprise at least one PMOS device and/or one NMOS device. The devices can include at least one CMOS device.

In one embodiment, mechanical stress is applied to a channel of an NMOS device in the digital mode. In one embodiment, stress is applied to a channel of a PMOS device in the digital mode.

In one embodiment, stress is not applied to a device operating in an analog mode to prevent an increase in electrical noise. The electrical noise can be flicker noise.

In one embodiment, the mechanical stress is applied to a selected device using a stress control layer on the circuit in proximity to the devices. The stress control layer can apply a tensile and/or a compressive stress. In one embodiment, stress is released in the stress control layer in proximity to devices to which stress is not applied. Portions of the stress control layer in which stress is released can include additional implanted ions. In one embodiment, the stress control layer is absent in proximity to devices to which stress is not applied. The stress control layer can include SiN, SiON and/or $SiO_2$. In one embodiment, the stress control layer is annealed. In one embodiment, the stress control layer is a layer formed by PECVD or LPCVD.

In one embodiment, a means by which the mechanical stress is applied comprises silicide.

In one embodiment, a means by which the mechanical stress is applied comprises an epitaxially grown source/drain structure.

In one embodiment, stress is applied to a first device in a first CMOS structure and to a second device in the first CMOS structure; and stress is not applied to a first device in a second CMOS structure and to a second device in the second CMOS structure. In one embodiment, the first CMOS structure operates in a digital mode and the second CMOS structure operates in an analog mode. In one embodiment, the first device in the first CMOS structure is a PMOS device; the second device in the first CMOS structure is an NMOS device; the PMOS device has a compressive stress applied to its channel; and the NMOS device has a tensile stress applied to its channel. In one embodiment, the first device in both the first CMOS structure and the second CMOS structure is a PMOS device. In one embodiment, the second device in both the first CMOS structure and the second CMOS structure is an NMOS device.

In one embodiment, a means by which the mechanical stress is applied comprises: a first stress control layer on the circuit, the first stress control layer applying a tensile stress on the devices, the first stress control layer being present only in proximity to devices requiring the tensile stress; a second stress control layer on the devices, the second stress control layer applying a compressive stress on the devices; and a stress release layer over the second stress control layer in proximity to a selected portion of the devices, the stress release layer releasing stress in devices that do not require the compressive stress. In one embodiment, the stress release layer comprises additional implanted ions.

In one embodiment, a means by which the mechanical stress is applied comprises: a first stress control layer on the circuit, the stress control layer applying a tensile stress on the devices, the first stress control layer being present only in proximity to devices requiring the tensile stress; a second stress control layer on the devices, the second stress control layer applying a compressive stress on the devices, the second stress control layer being present only in proximity to devices requiring the compressive stress.

According to another aspect, the invention is directed to a method of fabricating a circuit. In accordance with the method, a first MOS device of a first conductivity type is formed in a first area of the circuit. A second MOS device of the first conductivity type is formed in a second area of the circuit. A stress is applied to channels of the first and second MOS devices. The stress applied to the channel of the second MOS device is released.

In one embodiment, a stress control layer is formed on the circuit in proximity to the first and second MOS devices, the stress control layer applying the stress to the first and second MOS devices. The stress control layer can be formed by low pressure chemical vapor deposition (LPCVD). The stress control layer can also be formed by plasma enhanced chemical vapor deposition (PECVD). The stress control layer can include SiN formed at low temperature. In one embodiment, releasing the stress comprises implanting ions into the stress control layer. The stress control layer can comprise SiN.

In one embodiment, the stress is a compressive stress. In one embodiment, the stress is a tensile stress.

According to another aspect, the invention is directed to a method of fabricating a circuit. In accordance with the method, a first MOS device of a first conductivity type is formed in a first area of the circuit. A second MOS device of the first conductivity type is formed in a second area of the circuit. A stress is applied to a channel of the first MOS device.

In one embodiment, applying a stress to the channel of the first MOS device comprises forming a stress control layer on the circuit in proximity to the first and second MOS devices. The stress control layer can be formed by PECVD. The stress control layer can comprise SiON. The stress control layer can comprise $SiO_2$.

In one embodiment, the method further comprises removing the stress control layer from the second MOS device and leaving a portion of the stress control layer on the first MOS device. In one embodiment, the method further comprises annealing the portion of the stress control layer on the first MOS device.

In one embodiment, the method further comprises performing a first heat treatment to form a first phase silicide in proximity to the first and second MOS devices. A capping layer can be formed over the first and second MOS devices and the first phase silicide. A portion of the capping layer on the first MOS device and the first phase silicide can be removed. A second heat treatment can be performed to transform the first phase silicide into a second phase silicide.

In one embodiment, the stress is a compressive stress. In one embodiment, the stress is a tensile stress.

According to another aspect, the invention is directed to a method of fabricating a circuit. In accordance with the method, a first CMOS device is formed in a first area of the circuit, the first CMOS device comprising a first MOS device of a first conductivity type and a second MOS device of a second conductivity type. A second CMOS device is formed in a second area of the circuit, the second CMOS device comprising a third MOS device of the first conductivity type and a fourth MOS device of the second conductivity type. A tensile stress is applied to a channel of one of the first and second MOS devices, and a compressive stress is applied to the other of the first and second MOS devices. If stress is applied to channels of the MOS device in the second area, the stress applied to the channels of the MOS devices in the second area is removed.

In one embodiment, the method further comprises epitaxially growing a semiconductor layer in source/drain regions and on a gate of one of the first and second MOS devices, such that a compressive stress is applied to the one of the first and second MOS devices. A stress control layer is formed over the other of the first and second MOS devices such that a tensile stress is applied to the other of the first and second MOS devices.

In one embodiment, a first stress control layer is formed over one of the first and second MOS devices, the first stress control layer applying a tensile stress to the one of the first and second MOS devices. In one embodiment, the first stress control layer comprises at least one of SiN, SiON and $SiO_2$. A second stress control layer can be formed over the other of the first and second MOS devices, the second stress control layer applying a compressive stress to the other of the first and second MOS devices. In one embodiment, the second stress control layer comprises at least one of SiN and $SiO_2$.

In accordance with another aspect, the invention is directed to a circuit. The circuit includes a first MOS device of a first conductivity type in a first area of the circuit and a second MOS device of the first conductivity type in a second area of the circuit. A stress is applied to a channel of the first MOS device and a stress is not applied to the channel of the second MOS device.

In one embodiment, a stress control layer is formed on the first MOS device, the stress control layer applying the stress to the first MOS device. In one embodiment, the stress control layer comprises ions implanted into the stress control layer. In one embodiment, the stress control layer comprises SiN. In one embodiment, the stress control layer comprises SiON. In one embodiment, the stress control layer comprises $SiO_2$. In one embodiment, the stress is a compressive stress. In one embodiment, the stress is a tensile stress.

In one embodiment, the circuit further comprises a second phase silicide in proximity to a source/drain structure of the first MOS device.

According to another aspect, the invention is directed to a circuit. The circuit comprises a first CMOS device in a first area of the circuit, the first CMOS device comprising a first MOS device of a first conductivity type and a second MOS device of a second conductivity type. A second CMOS device in a second area of the circuit comprises a third MOS device of the first conductivity type and a fourth MOS device of the second conductivity type. A tensile stress is applied to a channel of one of the first and second MOS devices, and a compressive stress is applied to the other of the first and second MOS devices.

In one embodiment, the circuit further comprises an epitaxially grown semiconductor layer in source/drain regions and on a gate of one of the first and second MOS devices, such that a compressive stress is applied to the one of the first and second MOS devices.

In one embodiment, the circuit further comprises a stress control layer over the other of the first and second MOS devices such that a tensile stress is applied to the other of the first and second MOS devices.

In one embodiment, the circuit further comprises a first stress control layer over one of the first and second MOS devices, the first stress control layer applying a tensile stress to the one of the first and second MOS devices. In one embodiment, the first stress control layer comprises at least one of SiN, SiON and $SiO_2$. In one embodiment, the circuit further comprises a second stress control layer over the other of the first and second MOS devices, the second stress control layer applying a compressive stress to the other of the first and second MOS devices. The second stress control layer can include at least one of SiN and $SiO_2$.

BRIEF DESCRIPTION OF THE DRAWINGS

The foregoing and other features and advantages of the invention will be apparent from the more particular description of preferred embodiments of the invention, as illustrated in the accompanying drawing. The drawings are not necessarily to scale, emphasis instead being placed upon illustrating the principles of the invention. Like reference characters refer to like elements throughout the drawings.

DETAILED DESCRIPTION OF PREFERRED EMBODIMENTS OF THE INVENTION

In accordance with the invention, a semiconductor device such as an LSI device having mixed-signal applications, i.e., analog and digital applications, a layout of the semiconductor device and an approach to manufacturing the device, in which tensile and/or compressive stress are selectively applied to different portions of the device, i.e., analog and digital portions, are provided to enhance performance of the device and simultaneously reduce the effects of flicker noise on the performance of the device.

Figure 1:
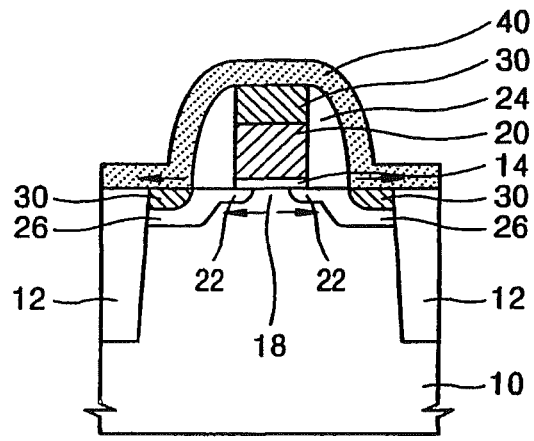
FIG. 1 is a schematic cross-sectional view of a MOS device illustrating an approach to introducing mechanical stress to improve carrier mobility in the device.
Figure 2A:
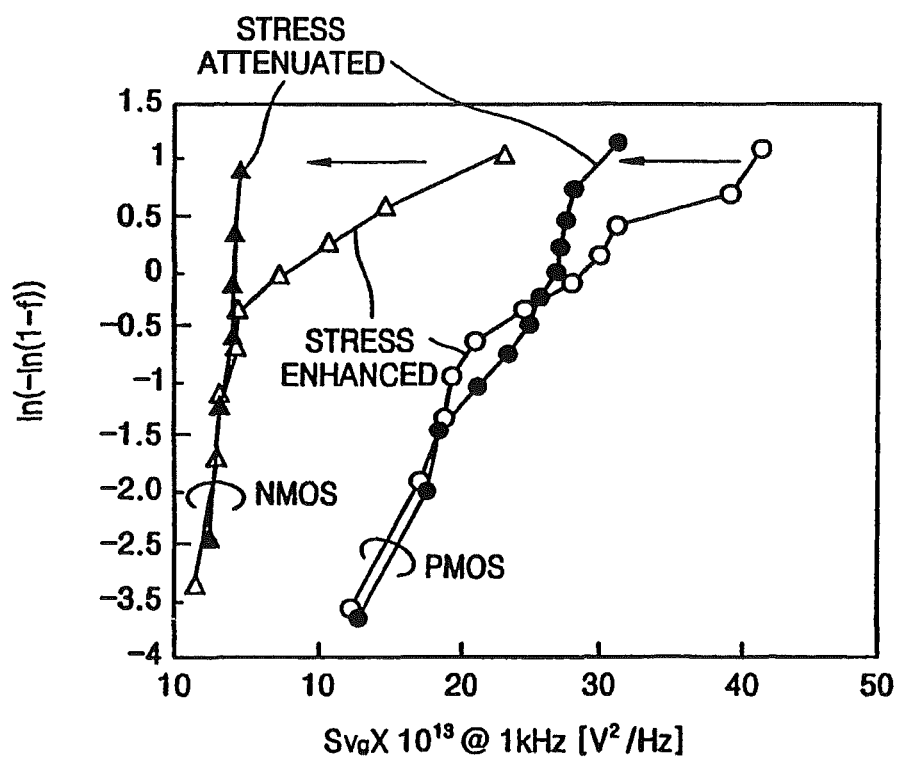
FIGS. 2A and 2B are graphs illustrating the relationship between stress engineering in a MOS device and noise.
Figure 2B:
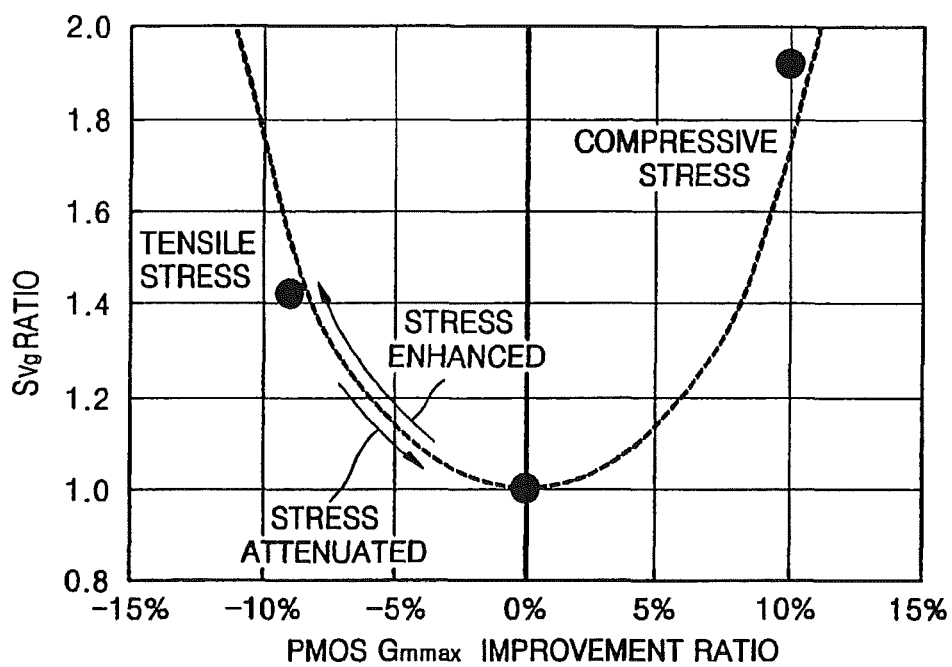
Figure 3:
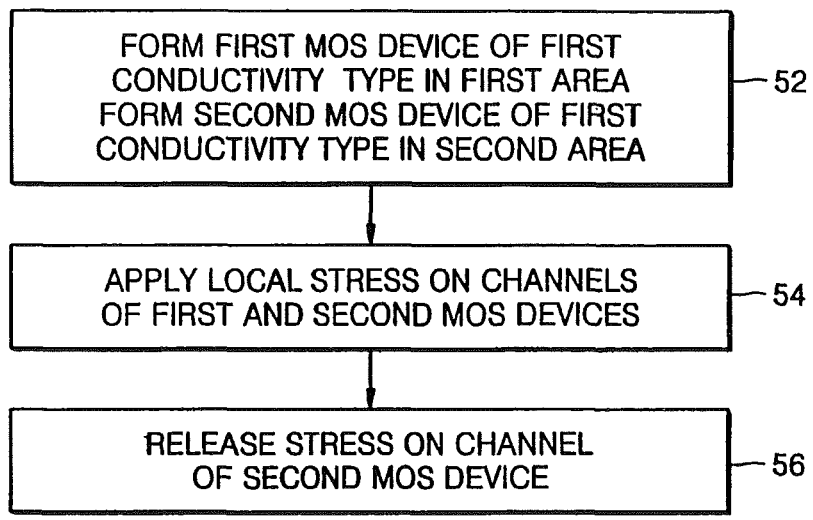
FIG. 3 contains a flow chart illustrating one approach to forming a device in accordance with the invention in which stress engineering is selectively applied to one or more selected portions of the device to enhance device performance while reducing the effects of noise on the device.
Figure 4:
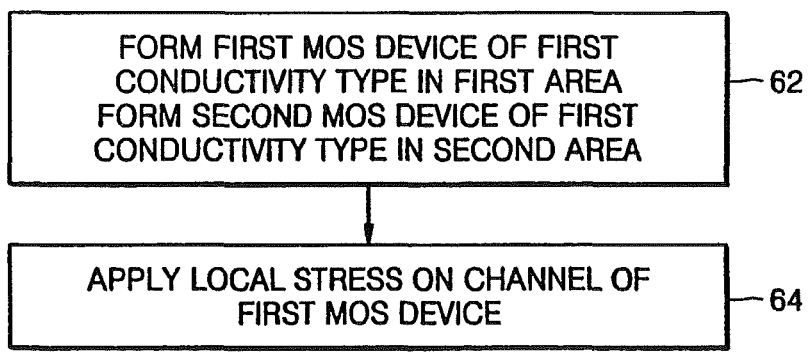
FIG. 4 contains a flow chart illustrating another approach to forming a device in accordance with the invention in which stress engineering is selectively applied to one or more selected portions of the device to enhance device performance while reducing the effects of noise on the device.
Figure 5:
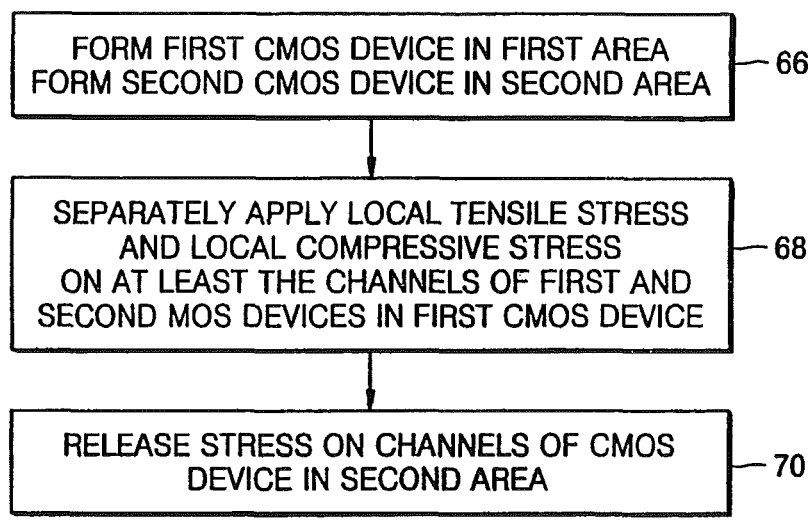
FIG. 5 contains a flow chart illustrating another approach to forming a device in accordance with the invention in which stress engineering is selectively applied to one or more selected portions of the device to enhance device performance while reducing the effects of noise on the device.

In the following description, several embodiments of the invention are described. The various embodiments can be considered to belong to one of three categories of embodiments, the categories being defined by the general approach to selectively applying stress engineering to a device to enhance performance while limiting the effects of noise on the device. FIGS. 3 through 5 contain flow charts which illustrate the three categories, respectively, of the embodiments of the invention. These categories are not to be construed as limiting the invention in any way. They are defined only for the purposes of clarity of the description and ease of understanding of the invention.

FIG. 3 contains a flow chart illustrating one approach to forming a device in accordance with the invention in which stress engineering is selectively applied to one or more selected portions of the device to enhance device performance while reducing the effects of noise on the device. FIG. 3 illustrates the first category of embodiments of the invention.

Referring to FIG. 3, in a step 52, a first MOS device of a first conductivity type, i.e., n-type or p-type, is formed in a first area of a device, for example a digital area, i.e., an area of the device in which digital circuits are being formed. A second MOS device of the first conductivity type, i.e., n-type or p-type, is formed in a second area of the device, i.e., an area of the device in which analog circuits are formed. Stress engineering is applied to selectively apply a local stress to the channels of the first and second MOS devices in the first and second areas in step 54. In step 56, stress is released or relieved in the channel of the second MOS device in the second area.

The above approach results in stress being applied only to the channel of the first MOS device. The first MOS device with the stress applied will have the enhanced performance characteristics resulting from the applied stress, but it may also have increased noise. On the other hand, the second MOS device will not have local stress applied, resulting in a circuit with reduced effects due to flicker noise. This approach can be applied in situations such as where the first area contains circuits which are less sensitive to noise than those in the second area. For example, the first area may include digital circuits, circuits for low-voltage operation and/or noise insensitive circuits, and the second area may include analog circuits, circuits for high-voltage operation and/or noise-sensitive circuits.

In one embodiment, the local stress can be applied by forming a stress control layer in both the first and second area. To release the stress on the second MOS device, ion implantation can be used, or the portion of the stress control layer on the second MOS device can be removed. Specific embodiments of this first category or group of approaches in accordance with the invention will be described in more detail below.

FIG. 4 contains a flow chart illustrating another approach to forming a device in accordance with the invention in which stress engineering is selectively applied to one or more selected portions of the device to enhance device performance while reducing the effects of noise on the device. FIG. 4 illustrates the second category of embodiments of the invention.

Referring to FIG. 4, in a step 62, a first MOS device of a first conductivity type, i.e., n-type or p-type, is formed in a first area of a device, for example a digital area, i.e., an area of the device in which digital circuits are being formed. A second MOS device of the first conductivity type, i.e., n-type or p-type, is formed in a second area of the device, i.e., an area of the device in which analog circuits are formed. Stress engineering is applied to selectively apply a local stress to the channel of the first MOS device in the first area in step 64.

The above approach results in stress being applied only to the channel of the first MOS device. The first MOS device with the stress applied will have the enhanced performance characteristics resulting from the applied stress, but it may also have increased noise. On the other hand, the second MOS device will not have local stress applied, resulting in a circuit with reduced effects due to flicker noise. This approach can be applied in situations such as where the first area contains circuits which are less sensitive to noise than those in the second area. For example, the first area may include digital circuits, circuits for low-voltage operation and/or noise insensitive circuits, and the second area may include analog circuits, circuits for high-voltage operation and/or noise-sensitive circuits.

Specific embodiments of this second category or group of approaches in accordance with the invention will be described in more detail below.

FIG. 5 contains a flow chart illustrating another approach to forming a device in accordance with the invention in which stress engineering is selectively applied to one or more selected portions of the device to enhance device performance while reducing the effects of noise on the device. FIG. 5 illustrates the third category of embodiments of the invention.

Referring to FIG. 5, in a step 66, a first CMOS device, which includes a first MOS device of a first conductivity type, i.e., n-type or p-type, and a second MOS device of a second conductivity type, i.e., p-type or n-type, is formed in a first area of a device, for example a digital area, i.e., an area of the device in which digital circuits are being formed. A second CMOS device, which includes a first (third) MOS device of the first conductivity type, i.e., n-type or p-type, and a second (fourth) MOS device of a second conductivity type, i.e., p-type or n-type, is formed in a second area of the device, i.e., an area of the device in which analog circuits are formed. Stress engineering is applied to selectively apply a local tensile stress and a local compressive stress to at least the channels of the first and second MOS devices in the first CMOS device in step 68. In step 70, stress is released or relieved in the channels of the MOS devices of the second CMOS device.

The above approach results in stress being applied only to the channels of the first and/or second MOS devices of the first CMOS device. The first CMOS device with the stress applied will have the enhanced performance characteristics resulting from the applied stress, but it may also have increased noise. On the other hand, the second CMOS device will not have local stress applied, resulting in a circuit with reduced effects due to flicker noise. This approach can be applied in situations such as where the first area contains circuits which are less sensitive to noise than those in the second area. For example, the first area may include digital circuits, circuits for low-voltage operation and/or noise insensitive circuits, and the second area may include analog circuits, circuits for high-voltage operation and/or noise-sensitive circuits.

Figure 6:
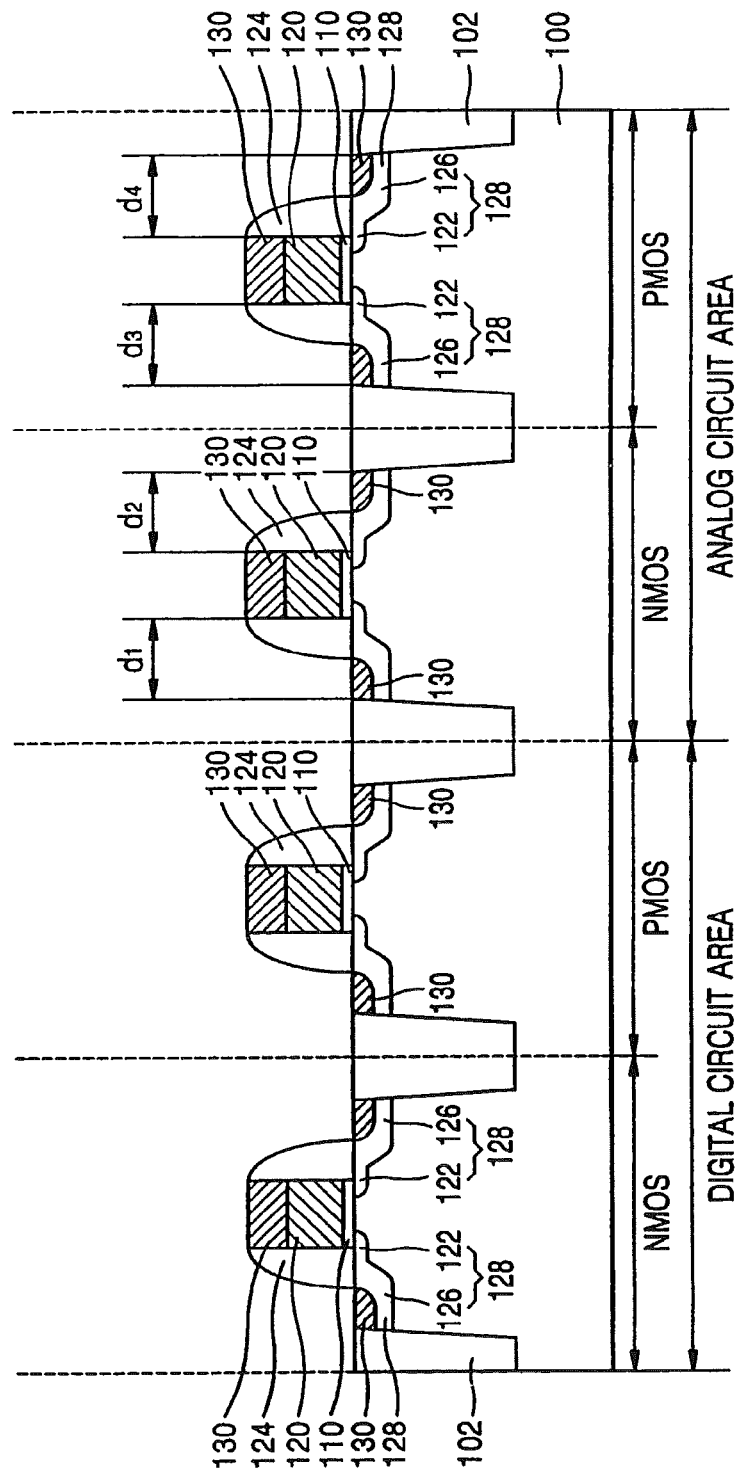
FIGS. 6 through 8 contain schematic cross-sectional views illustrating a method of forming a semiconductor device in accordance with an embodiment of the invention.
Figure 7:
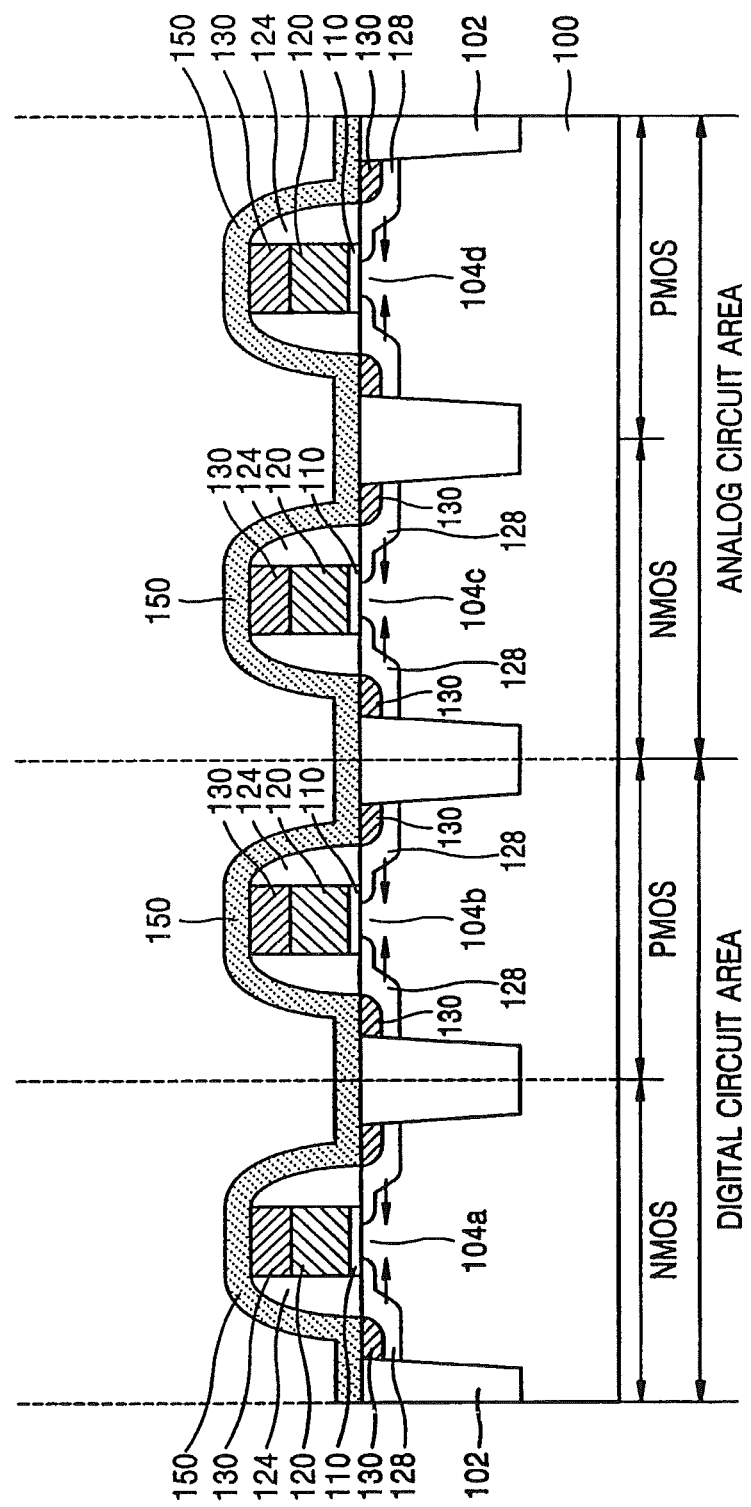
Figure 8:
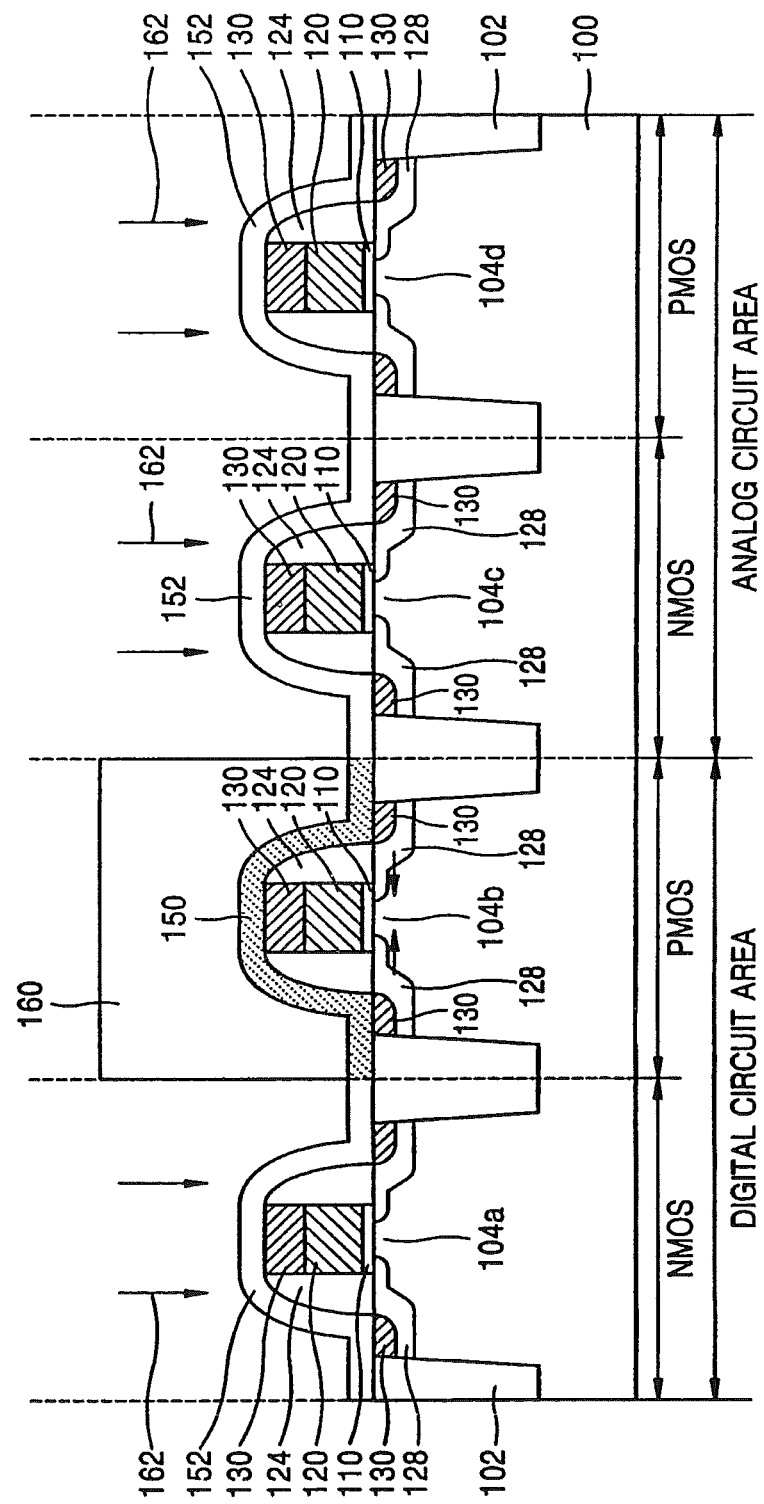

FIGS. 6 through 8 contain schematic cross-sectional views illustrating a method of forming a semiconductor device in accordance with an embodiment of the invention. This embodiment is of the type defined within the first category of embodiments described above.

Referring to FIG. 6, a substrate 100, made of, for example, silicon, is provided. The device includes a digital circuit area and an analog circuit area. Each of the digital circuit area and the analog circuit area includes a first NMOS transistor and a first PMOS transistor. A shallow trench isolation (STI) 102 is formed in the substrate 100 to isolate the devices. Each of the transistors includes source/drain regions 128, each of which includes a lightly-doped source/drain region 122 and a heavily-doped source/drain region 126. A gate dielectric layer pattern 110 is formed on the substrate for each transistor. A conductive gate pattern 120 is formed on a respective gate dielectric layer pattern 110 for each transistor, and a silicide layer pattern 130 is formed over each of the conductive gate patterns 120 and over exposed portions of the source/drain regions 128, specifically, over portions of the heavily-doped source/drain regions 126. The silicide layer patterns can be formed of, for example, cobalt silicide, nickel silicide, titanium silicide, or tungsten silicide. Sidewall spacers 124 are formed on the sides of all of the gate structures, including the gate dielectric layer patterns 110, the conductive gate patterns 120 and the silicide layer patterns 130. In one embodiment, it is desirable that, in the analog circuit area, the distance between the transistor gate structure and the STI 102, i.e., $d_1$, $d_2$, $d_3$, $d_4$, be more than 1.5 um.

Referring to FIG. 7, a stress control layer 150 is formed over the structure. The stress control layer 150 applies a compressive stress to the channels 104a, 104b, 104c, 104d of the transistors, as indicated by the arrows in the figure. The stress control layer 150 can be a layer of silicon nitride (SiN) deposited to a thickness of about 20-150 nm by plasma enhanced chemical vapor deposition (PECVD). A silicon nitride layer formed under a low temperature condition of 200-400 degrees C., or a silicon oxide layer with a compressive stress can also be used.

Referring to FIG. 8, the compressive stress is selectively released over the NMOS transistor of the digital circuit area and both of the transistors of the analog circuit area. A photoresist mask 160 is formed to cover only the PMOS transistor of the digital circuit area. Ions such as germanium, silicon, arsenic, indium, antimony, etc., ions are implanted, as indicted by 162, into the stress control layer 150, using the photoresist 160 as an ion implantation mask. In one embodiment, it is desirable that the ion implant energy be controlled within the range of 20-100 KeV, with consideration given to the thickness of the stress control layer 150, such that the implant ions are substantially prevented from being implanted into the silicide layer patterns 130.

As a result of the ion implantation, the stress control layer 150 is converted into a stress release or relax layer 152 everywhere except over the PMOS transistor in the digital circuit area. Therefore, compressive stress remains applied only to the channel 104b of the PMOS transistor in the digital circuit area. As a result, performance is improved in the PMOS transistor in the digital circuit area. No stress is remaining on the NMOS transistor in the digital circuit area and on both transistors in the analog circuit area, such that the flicker noise characteristics of those devices is not degraded. That is, in this embodiment, a PECVD silicon nitride stress control layer is used to enhance performance of only a PMOS device in the digital circuit area.

Figure 9:
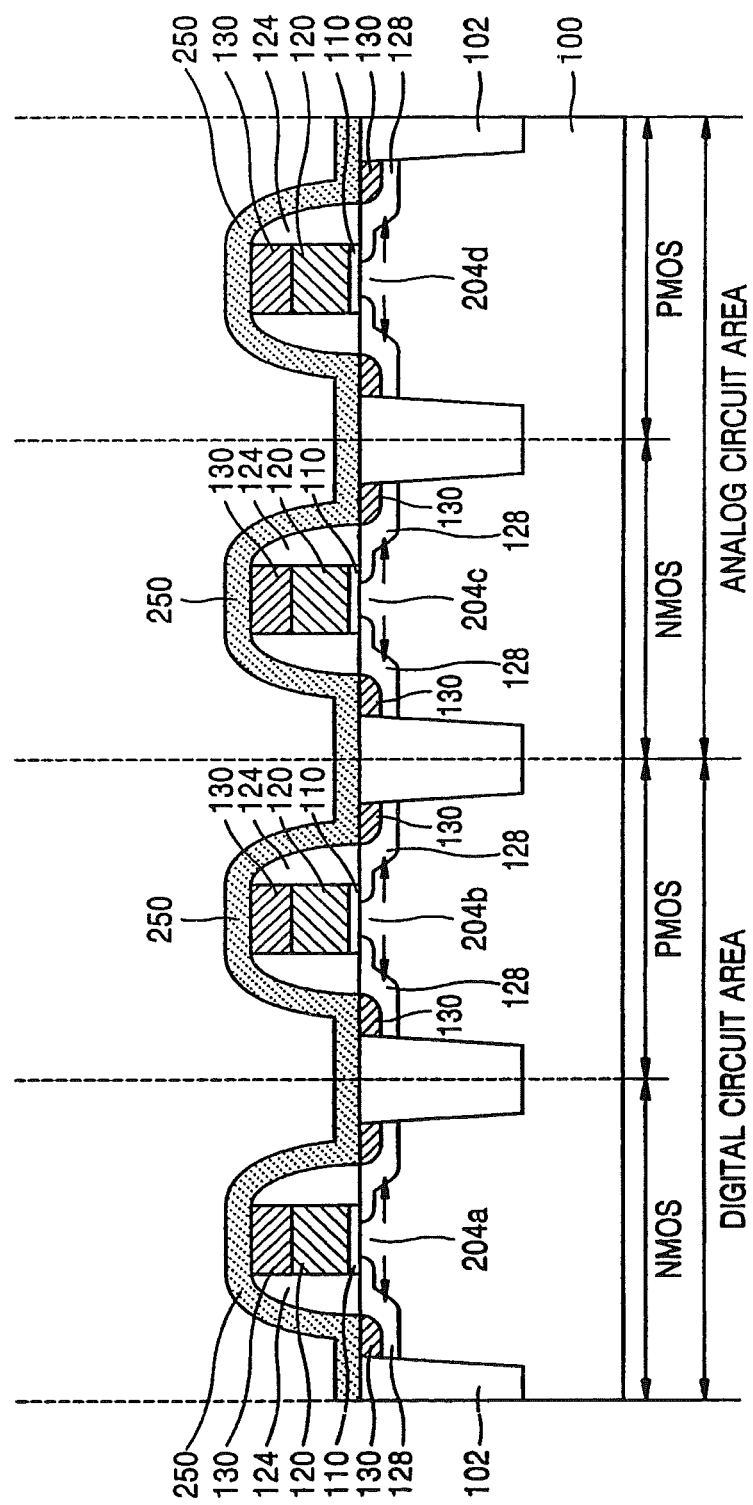
FIGS. 9 and 10 contain schematic cross-sectional views illustrating a method of forming a semiconductor device in accordance with another embodiment of the invention.
Figure 10:
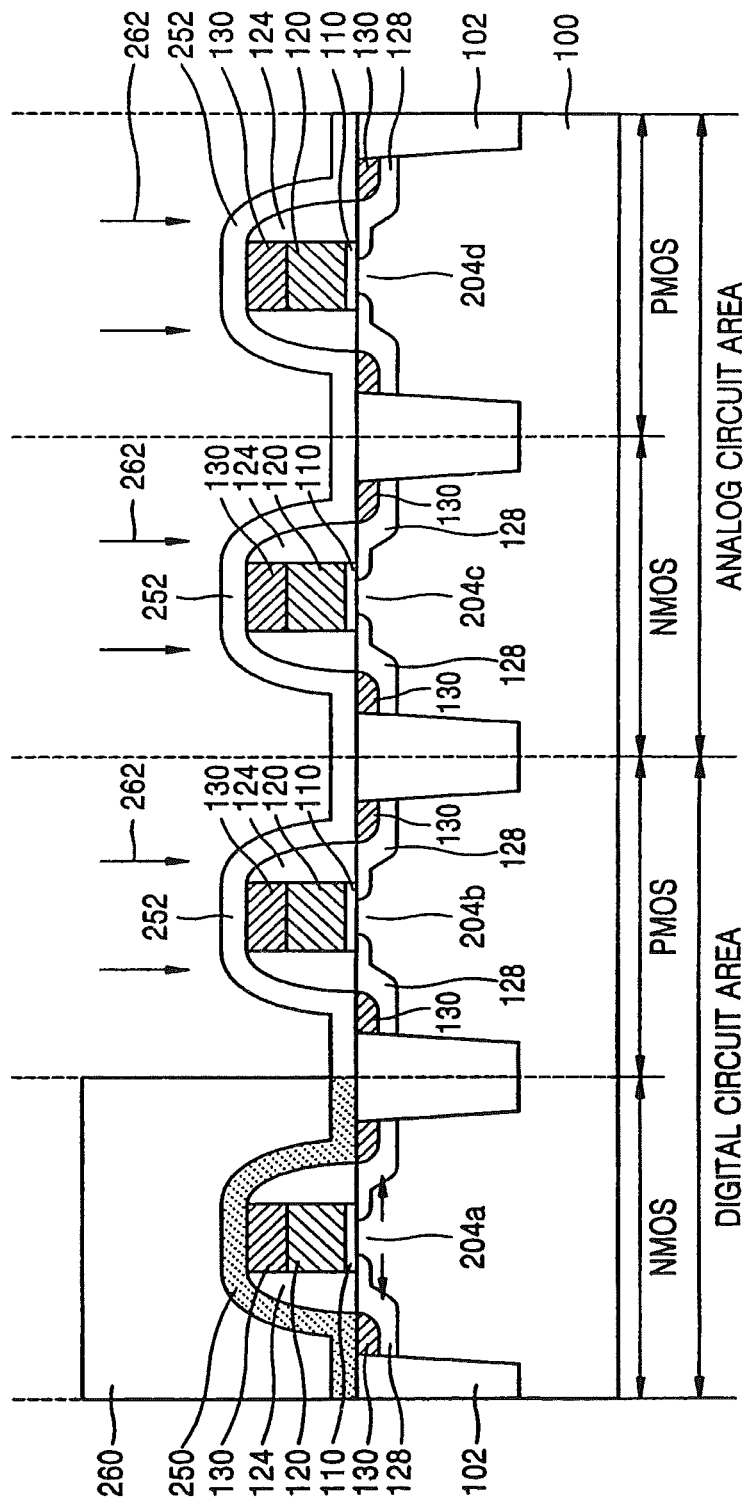

FIGS. 9 and 10 contain schematic cross-sectional views illustrating a method of forming a semiconductor device in accordance with another embodiment of the invention. This embodiment is of the type defined within the first category of embodiments described above. In the embodiment of FIGS. 9 and 10, the formation of the portion of the device including the substrate 100, STI 102, source/drain regions 128, gate dielectric patterns 110, conductive gate patterns 120, silicide patterns 130 and sidewall spacers 124 is the same as that of the embodiment of FIGS. 6 through 8. Accordingly, description thereof will not be repeated.

Referring to FIG. 9, a stress control layer 250, which applies a tensile stress, is formed on the structure. The stress control layer 250 can be a silicon nitride layer formed to a thickness of about 20-150 nm by low pressure chemical vapor deposition (LPCVD). Alternatively, the stress control layer 250 can be formed by forming a silicon nitride layer under a high-temperature condition of 400-800 degrees C. The stress control layer 250 can also be formed by forming a silicon oxynitride (SiON) layer by PECVD followed by an annealing step. Alternatively, the stress control layer 250 can be a silicon oxide layer which applies a tensile stress. The resulting tensile stress is locally imposed on the channels 204a, 204b, 204c, 204d of the transistors, as indicated in FIG. 9 by the arrows.

Referring to FIG. 10, the tensile stress is selectively released over the PMOS transistor of the digital circuit area and both of the transistors of the analog circuit area. A photoresist mask 260 is formed to cover only the NMOS transistor of the digital circuit area. Ions such as germanium, silicon, arsenic, indium, antimony, etc., ions are implanted, as indicted by 262, into the stress control layer 150, using the photoresist 260 as an ion implantation mask. In one embodiment, it is desirable that the ion implant energy be controlled within the range of 20-100 KeV, with consideration given to the thickness of the stress control layer 250, such that the implant ions are substantially prevented from being implanted into the silicide layer patterns 130.

As a result of the ion implantation, the stress control layer 250 is converted into a stress release or relax layer 252 everywhere except over the NMOS transistor in the digital circuit area. Therefore, tensile stress remains applied only to the channel 204a of the NMOS transistor in the digital circuit area. As a result, performance is improved in the NMOS transistor in the digital circuit area. No stress is remaining on the PMOS transistor in the digital circuit area and on both transistors in the analog circuit area, such that the flicker noise characteristics of those devices is not degraded. That is, in one embodiment, a LPCVD silicon nitride stress control layer is used to enhance performance of only an NMOS device in the digital circuit area.

Figure 11:
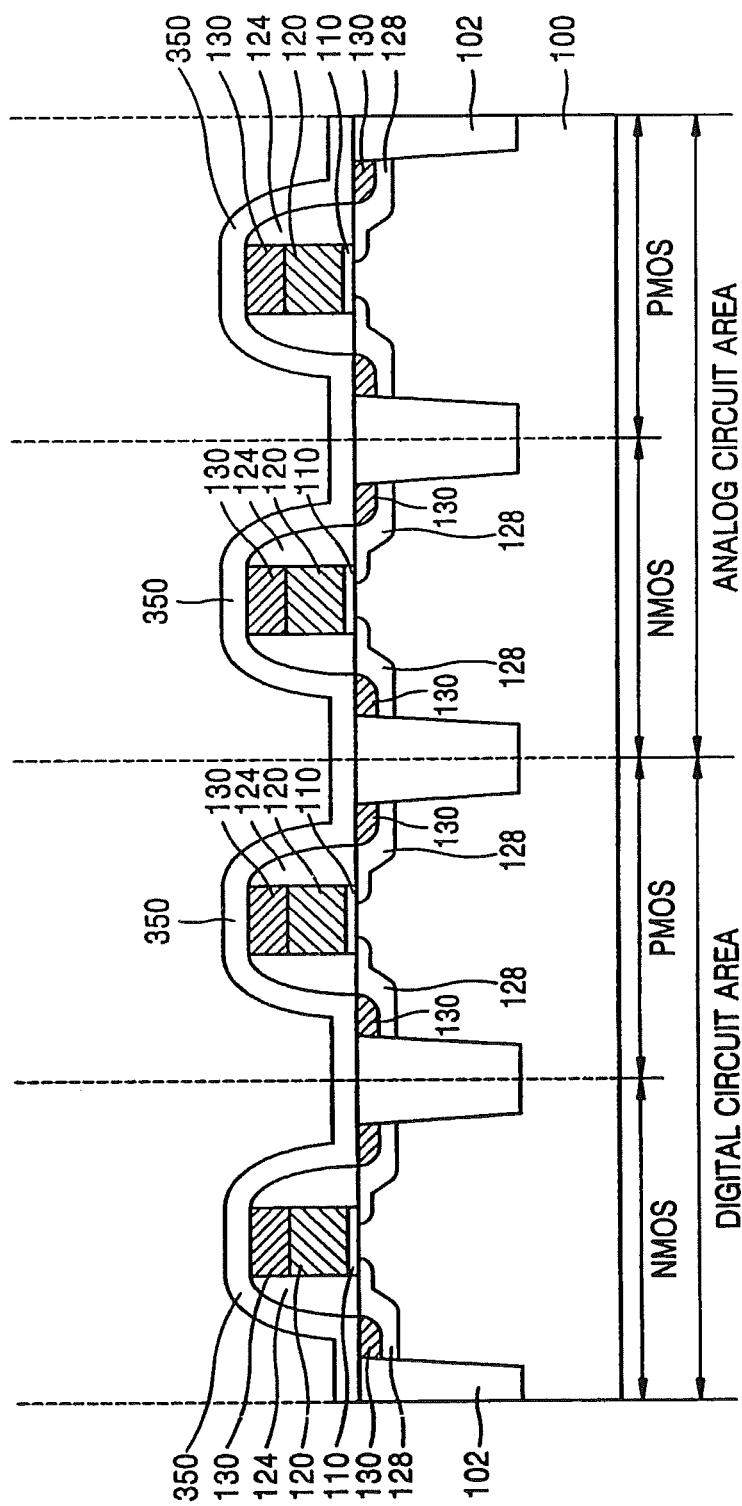
FIGS. 11 through 13 contain schematic cross-sectional views illustrating a method of forming a semiconductor device in accordance with another embodiment of the invention.
Figure 12:
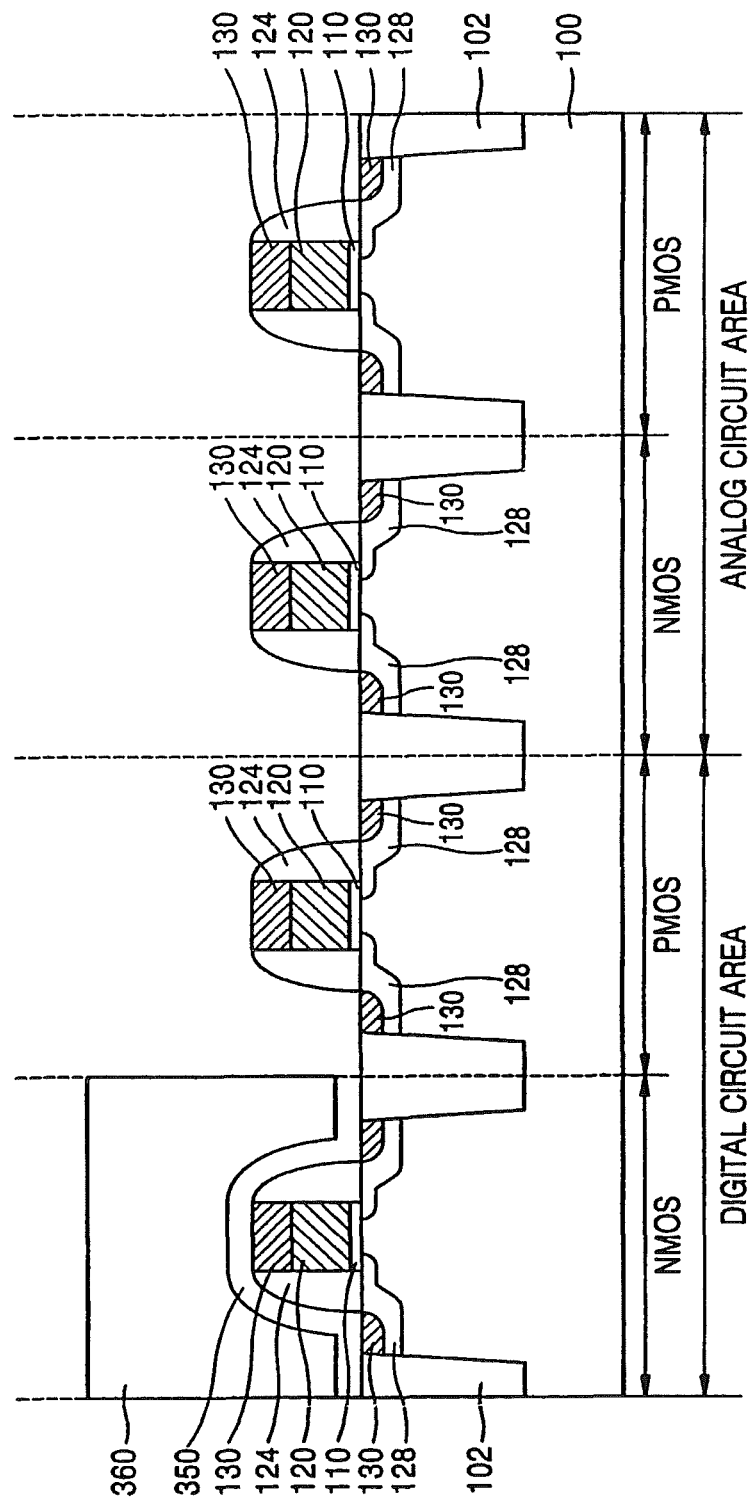
Figure 13:
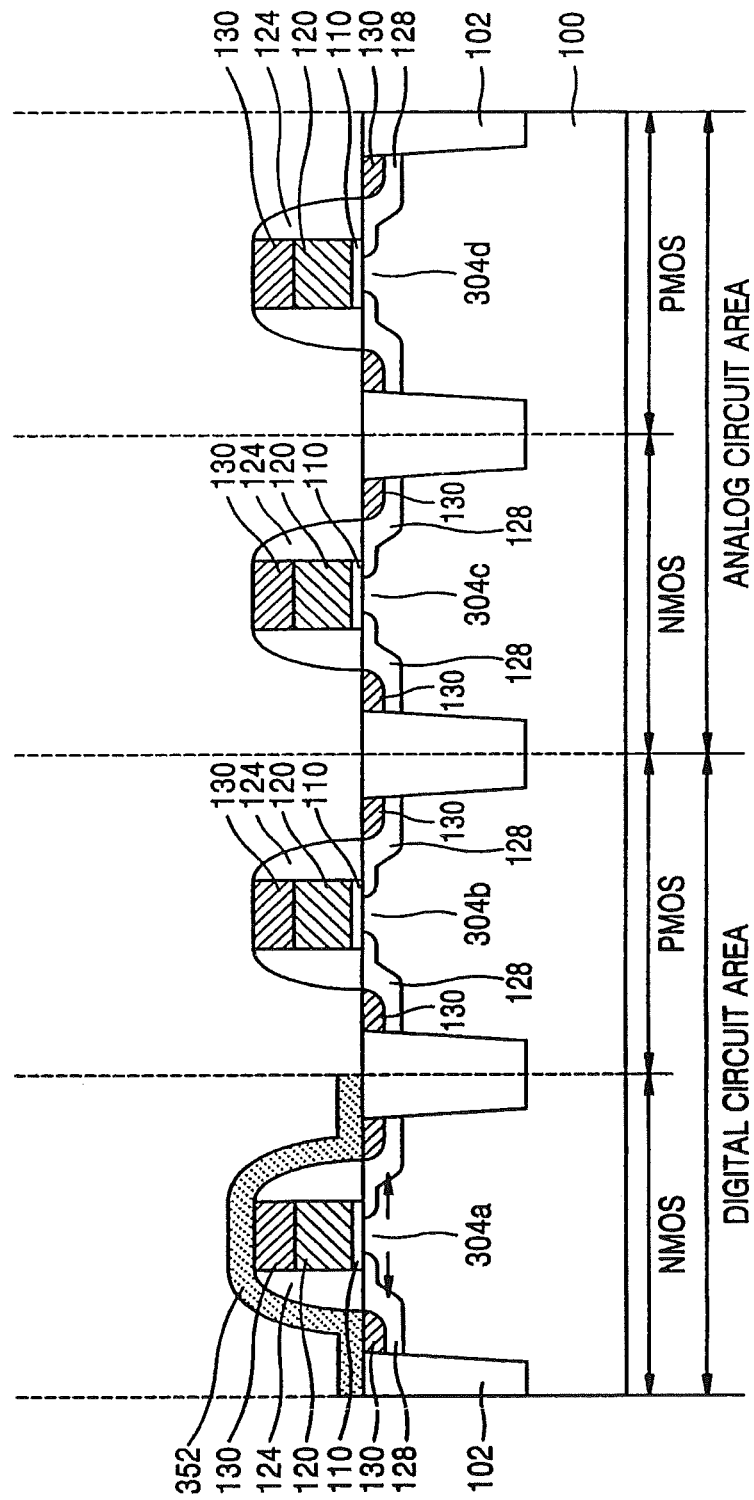

FIGS. 11 through 13 contain schematic cross-sectional views illustrating a method of forming a semiconductor device in accordance with another embodiment of the invention. This embodiment is of the type defined within the second category of embodiments described above. In the embodiment of FIGS. 11 through 13, the formation of the portion of the device including the substrate 100, STI 102, source/drain regions 128, gate dielectric patterns 110, conductive gate patterns 120, silicide patterns 130 and sidewall spacers 124 is the same as that of the embodiment of FIGS. 6 through 8. Accordingly, description thereof will not be repeated.

Referring to FIG. 11, a stress control layer 350, which applies no initial net stress, is formed on the structure. The stress control layer 350 can be a silicon oxynitride layer formed to a thickness of about 20-150 nm by plasma enhanced chemical vapor deposition (PECVD).

Referring to FIG. 12, a photoresist pattern 360 is formed and patterned such that it remains only over the NMOS transistor in the digital circuit area. Next, using the photoresist pattern 360 as a mask, the stress control layer 350 is removed everywhere except over the NMOS transistor in the digital circuit area.

Next, referring to FIG. 13, the photoresist pattern 360 is removed, and the remaining portion of the stress control layer is annealed. As a result of the annealing, the stress control layer 350 is converted into a tensile stress layer 352, which applies a tensile stress to the channel 304a of the NMOS transistor in the digital circuit area as shown by the arrows in the figure. The remaining transistor channels 304b, 304c, 304d have no stress applied, due to the absence of the tensile stress layer 352 in their respective transistor regions.

Hence, in this embodiment, tensile stress is locally imposed on the channel 304a of the NMOS transistor in the digital circuit area. As a result, performance is improved in the NMOS transistor in the digital circuit area. No stress is applied to the PMOS transistor in the digital circuit area or on both transistors in the analog circuit area, such that the flicker noise characteristics of those devices is not degraded. Hence, in this embodiment, an annealed PECVD silicon oxynitride layer, which has a tensile stress, is used to enhance performance of only an NMOS device in the digital circuit area.

Figure 14:
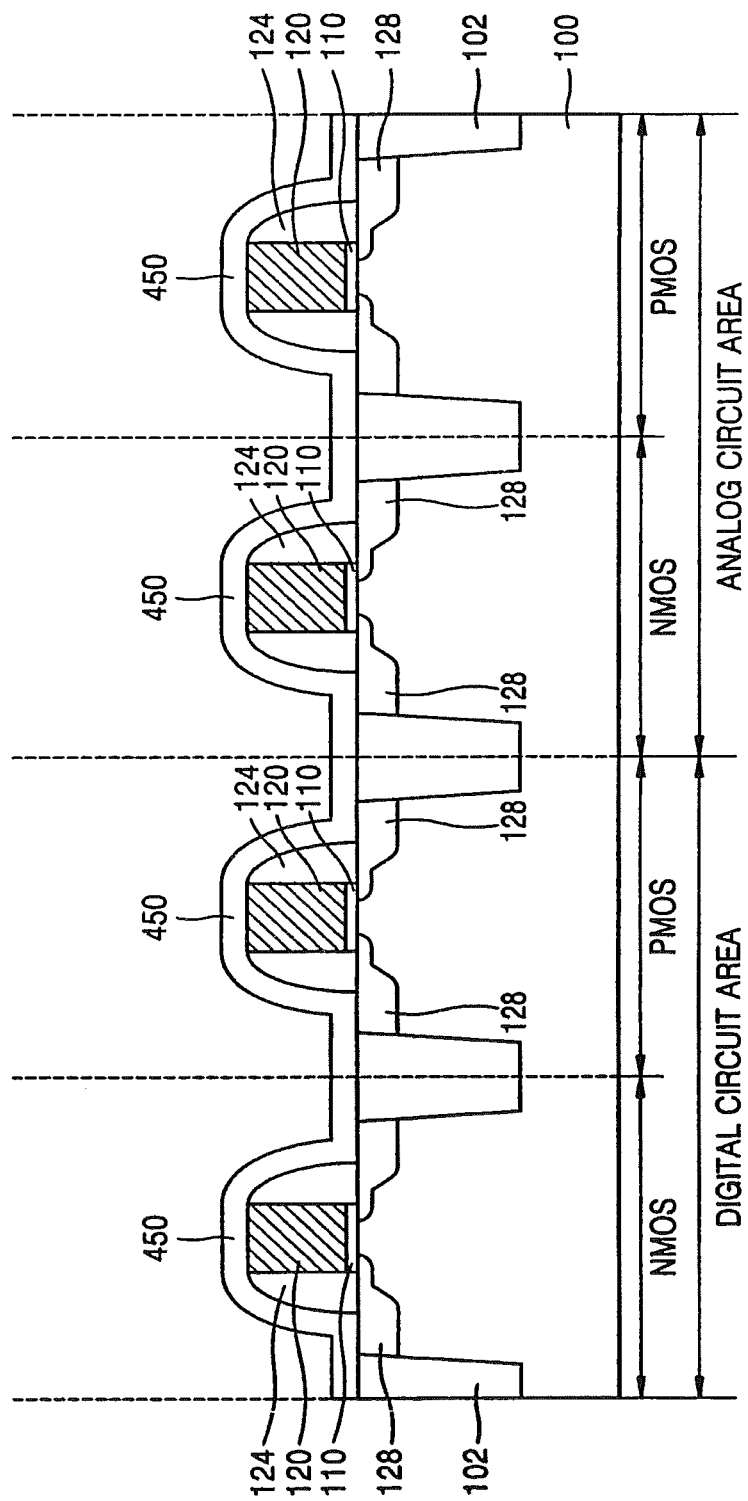
FIGS. 14 through 16 contain schematic cross-sectional views illustrating a method of forming a semiconductor device in accordance with another embodiment of the invention.
Figure 15:
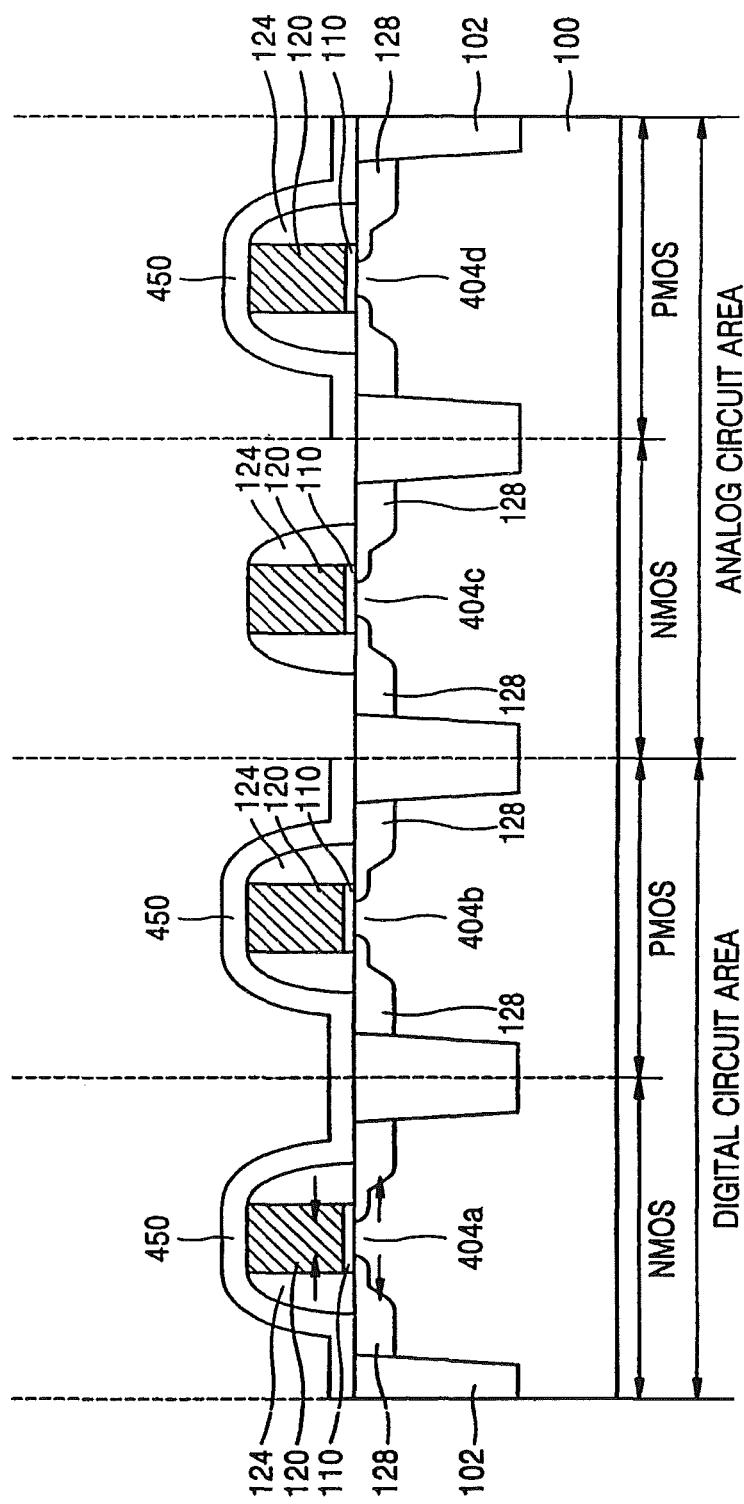
Figure 16:
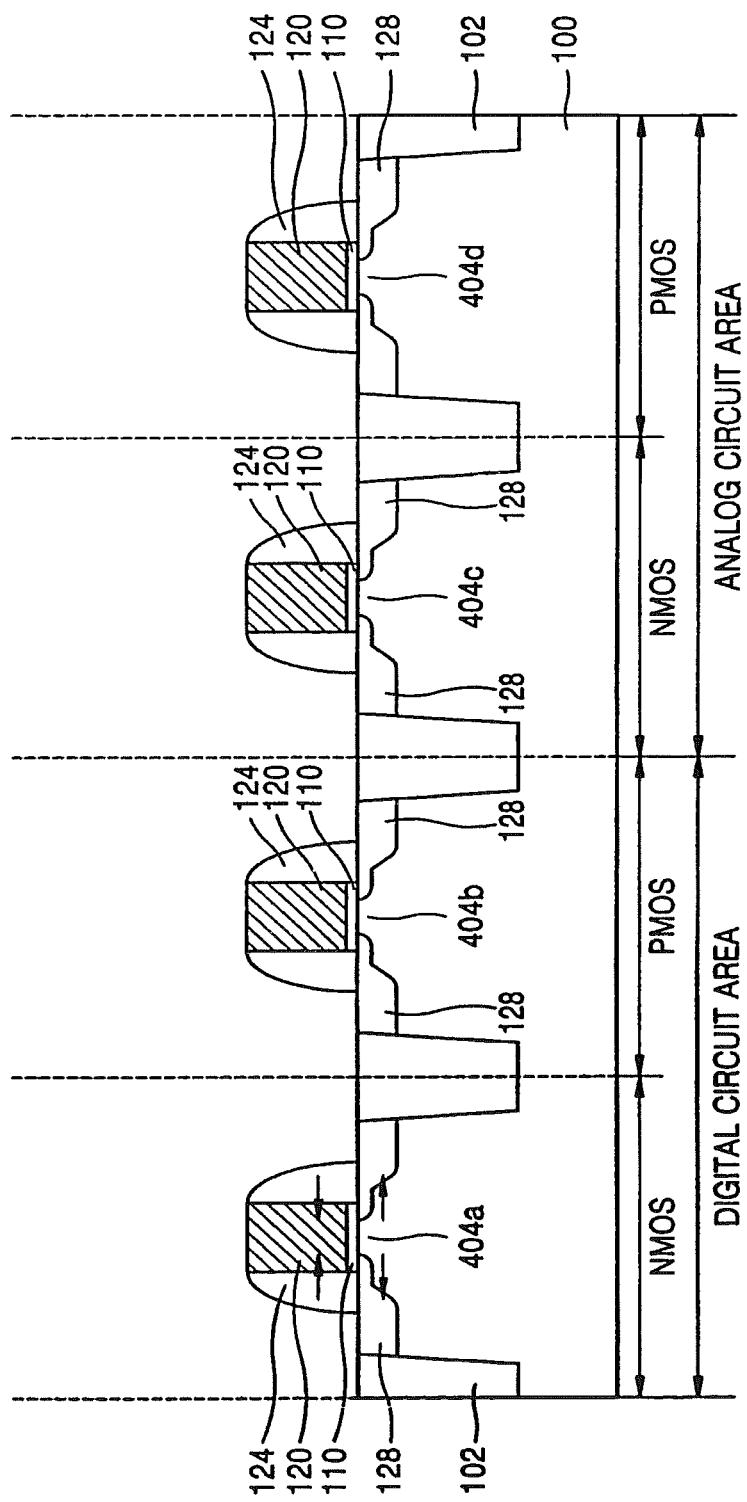

FIGS. 14 through 16 contain schematic cross-sectional views illustrating a method of forming a semiconductor device in accordance with another embodiment of the invention. This embodiment is of the type defined within the second category of embodiments described above. In the embodiment of FIGS. 14 through 16, the formation of the portion of the device including the substrate 100, STI 102, source/drain regions 128, gate dielectric patterns 110, conductive gate patterns 120 and sidewall spacers 124 is the same as that of the embodiment of FIGS. 6 through 8. Accordingly, description thereof will not be repeated. In the embodiment of FIGS. 14 through 16, an annealed PECVD layer of silicon dioxide $SiO_2$, which has a tensile stress, is formed to enhance NMOS performance.

Referring to FIG. 14, a $SiO_2$ layer 450 is formed on the structure. The $SiO_2$ layer 450 can be formed to a thickness of about 20-100 nm by plasma enhanced chemical vapor deposition (PECVD) at a temperature below about 600 degrees C.

Referring to FIG. 15, the portion of the $SiO_2$ layer on the NMOS transistor of the analog circuit area is removed. Next, the $SiO_2$ layer is annealed at a temperature of 900-1150 degrees C. to introduce a tensile stress in the $SiO_2$ layer and, therefore in the NMOS transistor of the digital circuit area. It is noted that the $SiO_2$ layer is removed from the NMOS transistor in the analog circuit area because it is desired to prevent stress from being applied to that transistor. The portion of the $SiO_2$ layer over the PMOS transistors need not be removed because the annealing of the $SiO_2$ layer will not affect the PMOS transistors. For example, it is known that residual compressive stress in arsenic implanted polysilicon (as used typically in an NMOS gate) is induced by high-temperature annealing of the CVD $SiO_2$ with high tensile stress. Accordingly, after the annealing, there is tensile stress applied to the channel 404a and compressive stress applied to the gate 120 of the NMOS transistor in the digital circuit area, as indicated by the arrows in the figure. There is no stress applied to any of the other channels 404b, 404c, 404d or gates 120.

Next, referring to FIG. 16, the remaining portion of the SiO$_2$ layer can be removed to permit subsequent process steps, such as silicidation of the source/drain regions of the device. It should be noted that the remaining portion of the SiO$_2$ layer need not be removed. The compressive stress in the gate 120 and the tensile stress in the channel 404a will be maintained, whether the SiO$_2$ layer is completely removed or it remains on the NMOS transistor in the digital circuit area.

Hence, in this embodiment, tensile stress is locally imposed on the channel 404a of the NMOS transistor in the digital circuit area and compressive stress is applied to its gate. As a result, performance is improved in the NMOS transistor in the digital circuit area. No stress is applied to the PMOS transistor in the digital circuit area or on both transistors in the analog circuit area, such that the flicker noise characteristics of those devices is not degraded. It should be noted that, in this embodiment, the heat budget for source/drain activation can be used to induce tensile stress without introducing an additional high-temperature anneal process.

FIGS. 17 through 20 contain schematic cross-sectional views illustrating a method of forming a semiconductor device in accordance with another embodiment of the invention. This embodiment is of the type defined within the second category of embodiments described above. In this embodiment, a silicidation process is used to enhance performance of an NMOS transistor. In the embodiment of FIGS. 17 through 20, the formation of the portion of the device including the substrate 100, STI 102, source/drain regions 128, gate dielectric patterns 110, conductive gate patterns 120 and sidewall spacers 124 is the same as that of the embodiment of FIGS. 6 through 8. Accordingly, description thereof will not be repeated. However, it is noted that in the embodiment of FIGS. 17 through 20, silicide patterns 830 are shown instead of the silicide patterns 130. In this embodiment, it is these silicide patterns 830, as described below, that enhance the NMOS performance.

Figure 17:
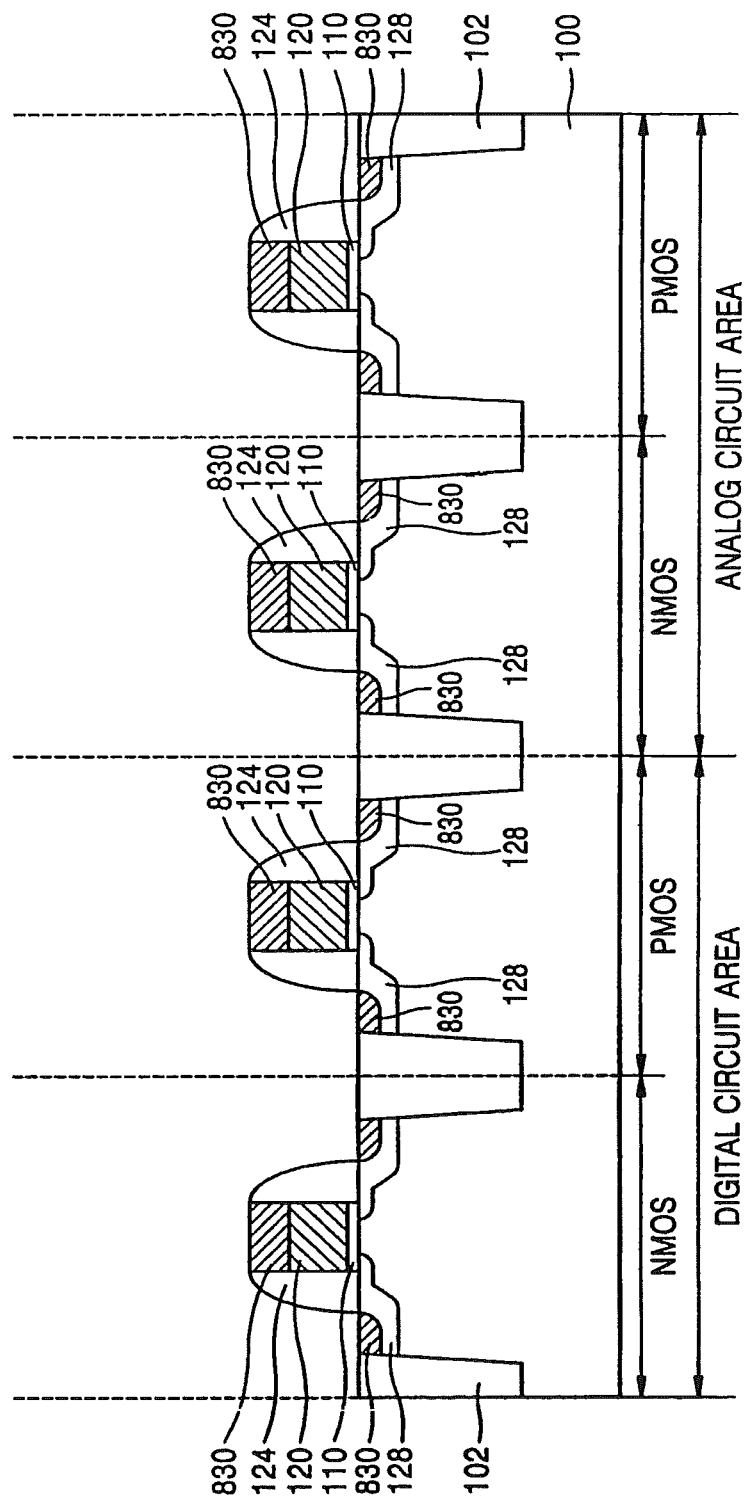
FIGS. 17 through 20 contain schematic cross-sectional views illustrating a method of forming a semiconductor device in accordance with another embodiment of the invention.

Referring to FIG. 17, the silicide patterns 830 are formed by depositing a metal layer pattern on the structure where the silicide patterns 830 are to be formed, i.e., on the silicon of the source/drain regions 128 and conductive gate 120. The metal can be, for example, cobalt. Then, a first rapid thermal annealing (RTA) process is carried out at approximately 450 degrees C. to form patterns of cobalt monosiliside CoSi 830. That is, a first phase metal silicide is formed by a first heat treatment. After the first RTA is performed, the remaining cobalt is removed.

Figure 18:
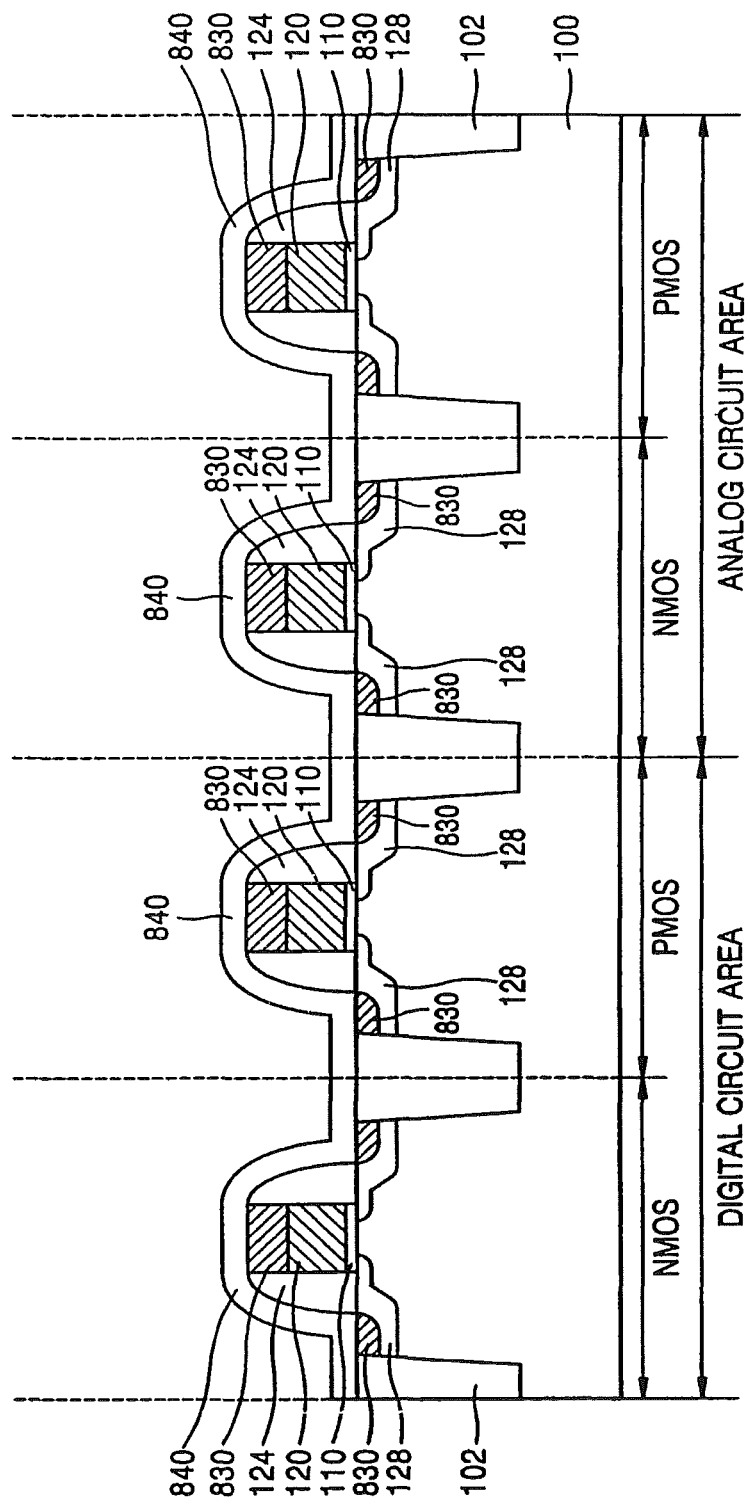

Referring to FIG. 18, a capping layer 840 is formed over the structure after the first RTA is performed. The capping layer 840 can be a layer of titanium nitride TiN formed to a thickness of about 5-20 nm.

Figure 19:
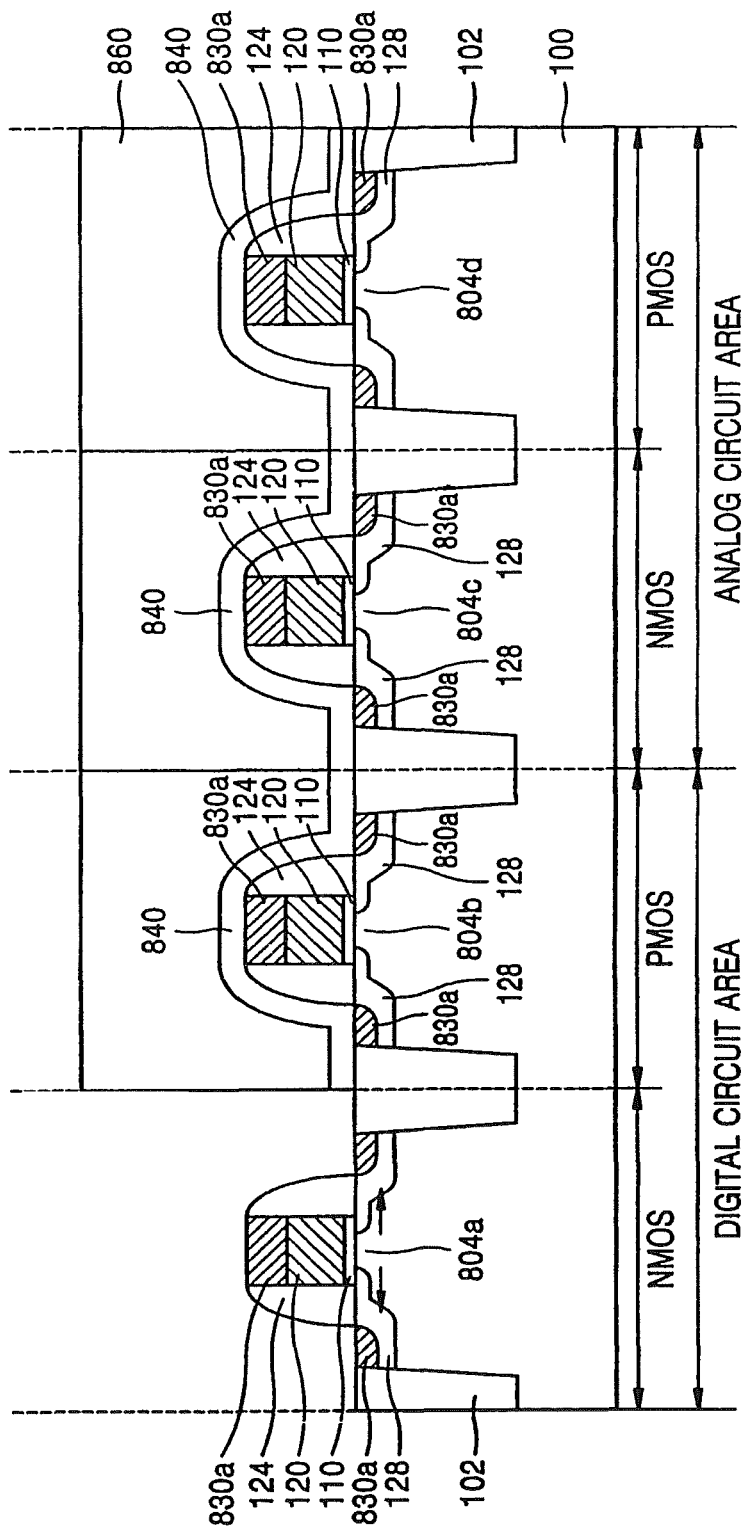

Referring to FIG. 19, a photoresist pattern 860 is formed over the structure such that only the portion of the capping layer 840 that is formed over the NMOS transistor in the digital circuit area is exposed. Then, that exposed portion of the capping layer 840 is removed. Next, a second RTA process is carried out at a temperature of about 700-1100 degrees C. As a result of the second RTA process, the silicidation patterns 830 transition to a second phase metal silicide, for example, the CoSi transitions to cobalt disilicide CoSi$_2$. This results in formation of new silicide patterns 830a on the gates and source/drain regions. During the process of transition from the first phase metal silicide, e.g., CoSi, to the second phase metal silicide, e.g., CoSi2, a tensile stress is imposed on the channel 804a of the NMOS transistor in the digital circuit area. Relatively little or no tensile stress is applied to the other channels 804b, 804c, 804d because the capping layer 840 over their respective transistors acts to attenuate stress. That is, tensile stress is locally imposed on the channel 804a of the NMOS transistor in the digital circuit area, but the channels 804b, 804c, 804d of the remaining transistors are not affected by the annealing because there is present on the transistors a capping layer 840 for stress attenuation.

Figure 20:
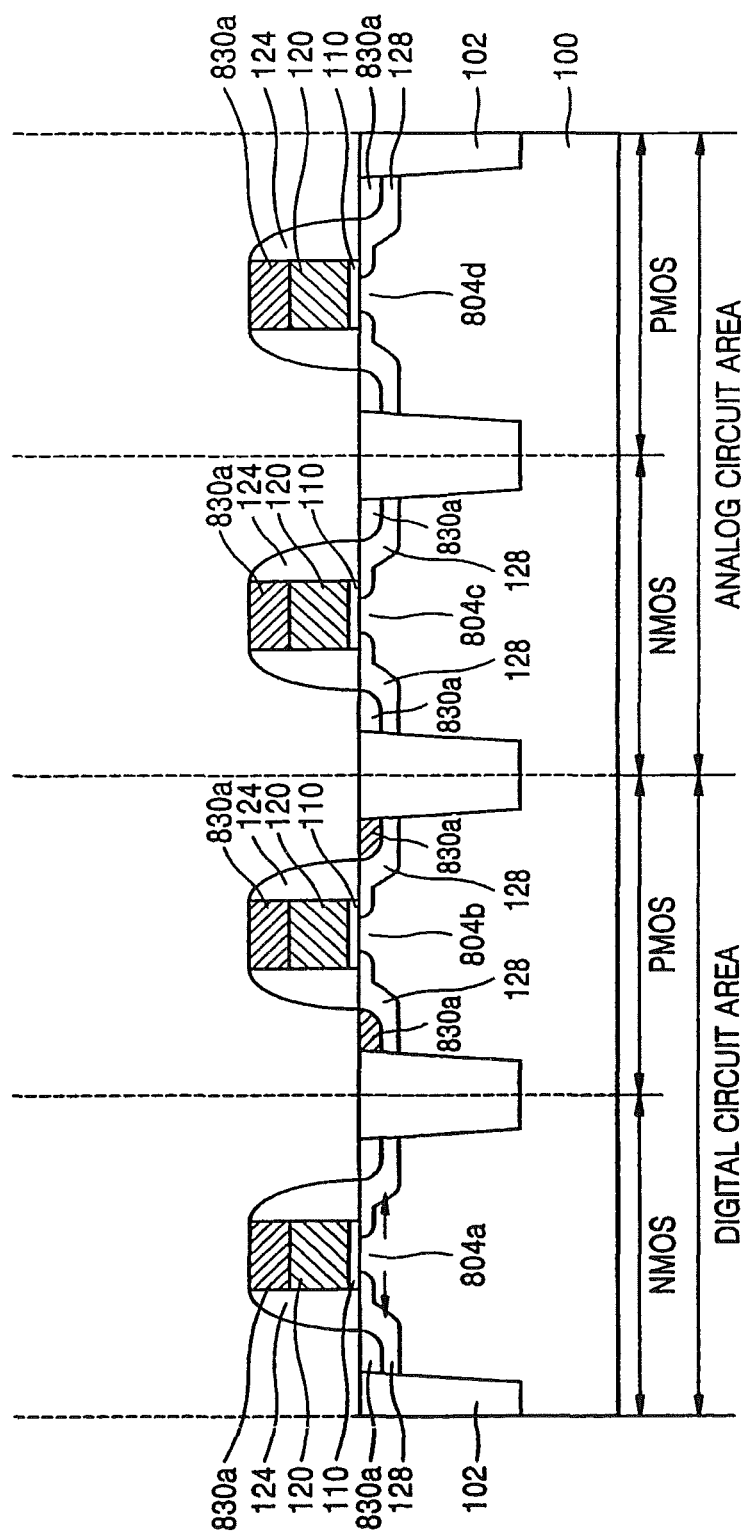

Referring to FIG. 20, the remainder of the capping layer 840 is removed. The result is a device with silicide layers 830a which apply a tensile stress to the channel 804a of the NMOS transistor in the digital circuit area and which do not apply a stress to the remaining transistors.

FIGS. 21 through 27 contain schematic cross-sectional views illustrating a method of forming a semiconductor device in accordance with another embodiment of the invention. This embodiment is of the type defined within the third category of embodiments described above. In this embodiment, an epitaxially grown source/drain structure is used to induce compressive stress on a PMOS transistor to enhance performance of the PMOS transistor.

Figure 21:
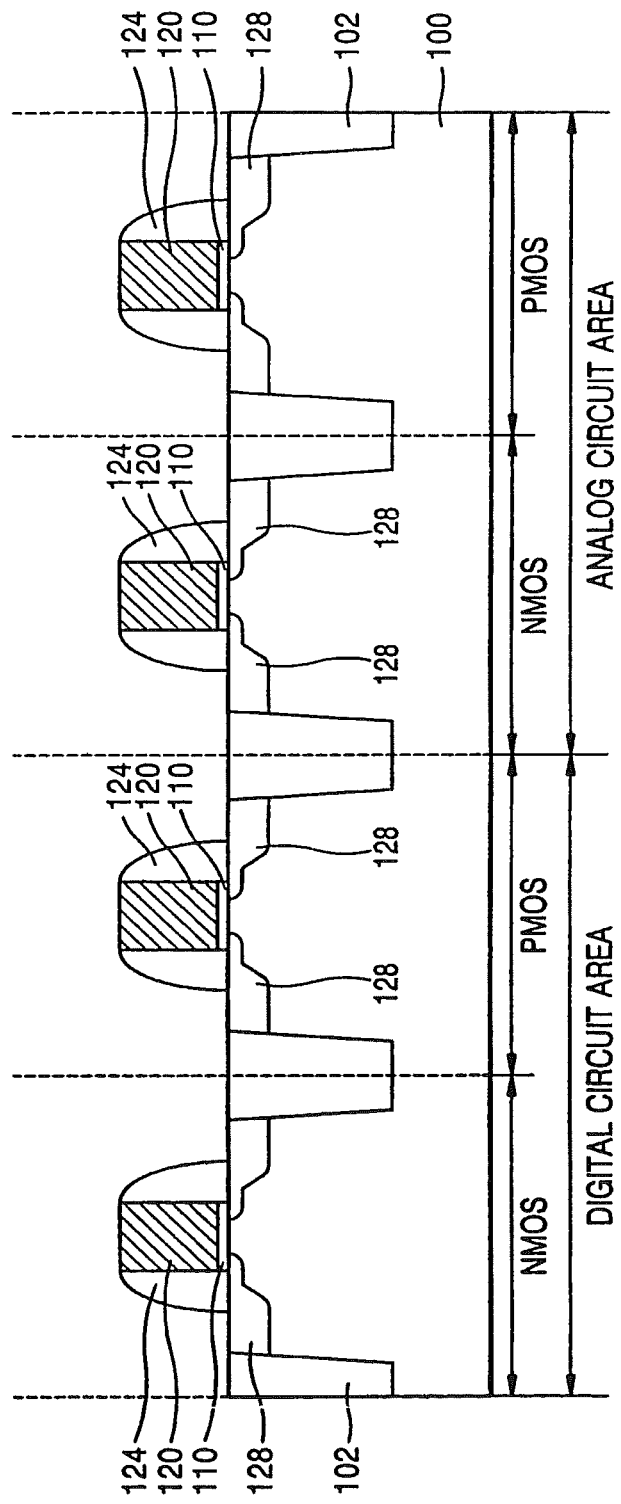
FIGS. 21 through 27 contain schematic cross-sectional views illustrating a method of forming a semiconductor device in accordance with another embodiment of the invention.

Referring to FIG. 21, CMOS structures, each including an NMOS transistor and a PMOS transistor, are formed in both a digital circuit area and an analog circuit area of a device. The device includes a digital circuit area and an analog circuit area. Each of the digital circuit area and the analog circuit area includes a first NMOS transistor and a first PMOS transistor. A substrate 100, made of, for example, silicon, is provided. A shallow trench isolation (STI) 102 is formed in the substrate 100 to isolate the devices. Each of the transistors includes source/drain regions 128, each of which includes a lightly-doped source/drain region 122 and a heavily-doped source/drain region 126. A gate dielectric layer pattern 110 is formed on the substrate for each transistor. A conductive gate pattern 120 is formed on a respective gate dielectric layer pattern 110 for each transistor, and sidewall spacers 124 are formed on the sides of all of the gate structures, including the gate dielectric layer patterns 110 and the conductive gate patterns 120.

Figure 22:
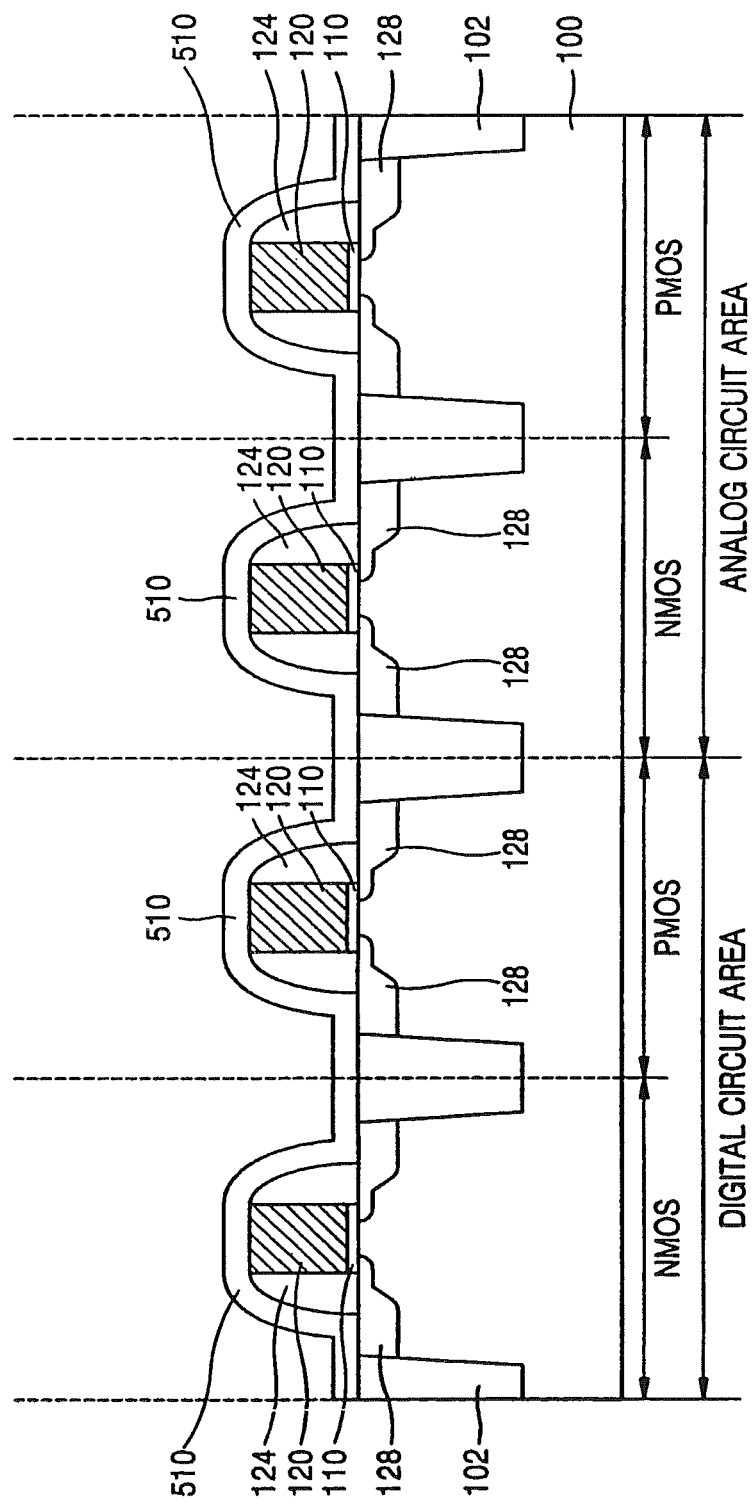

Referring to FIG. 22, a mask layer 510 is formed over the structure of FIG. 21. The mask layer can be made of, for example, silicon dioxide, silicon nitride, or other similar material.

Figure 23:
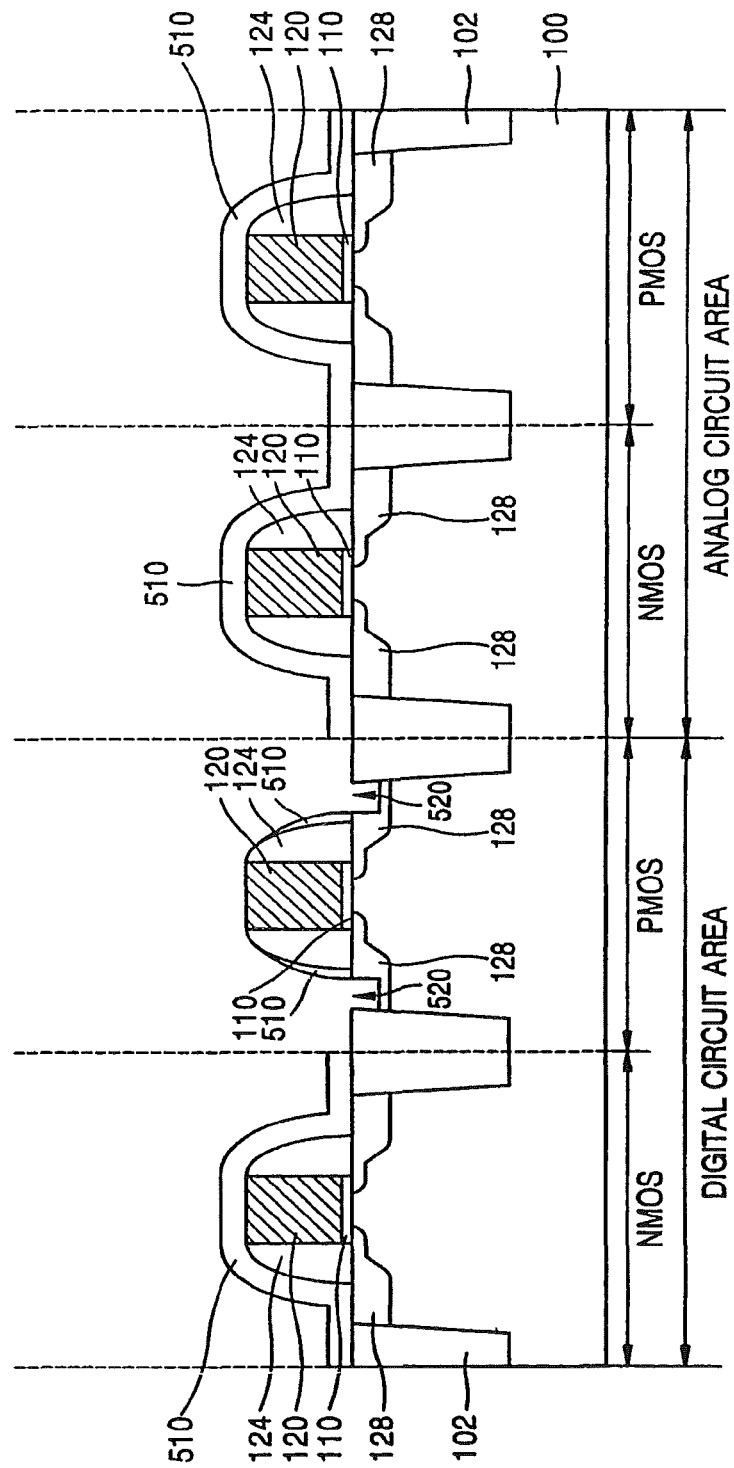

Referring to FIG. 23, the portion of the mask layer 510 that is over the PMOS transistor in the digital circuit area is at least partially removed, leaving a small portion of the mask layer 510 on the sidewall spacer 124. Then, a portion of the source/drain region 128 of the exposed PMOS transistor is removed beside its gate structure by a self-aligned, vertical, anisotropic etching. As a result, a groove 520 is formed to have a depth of about 10-100 nm.

Figure 24:
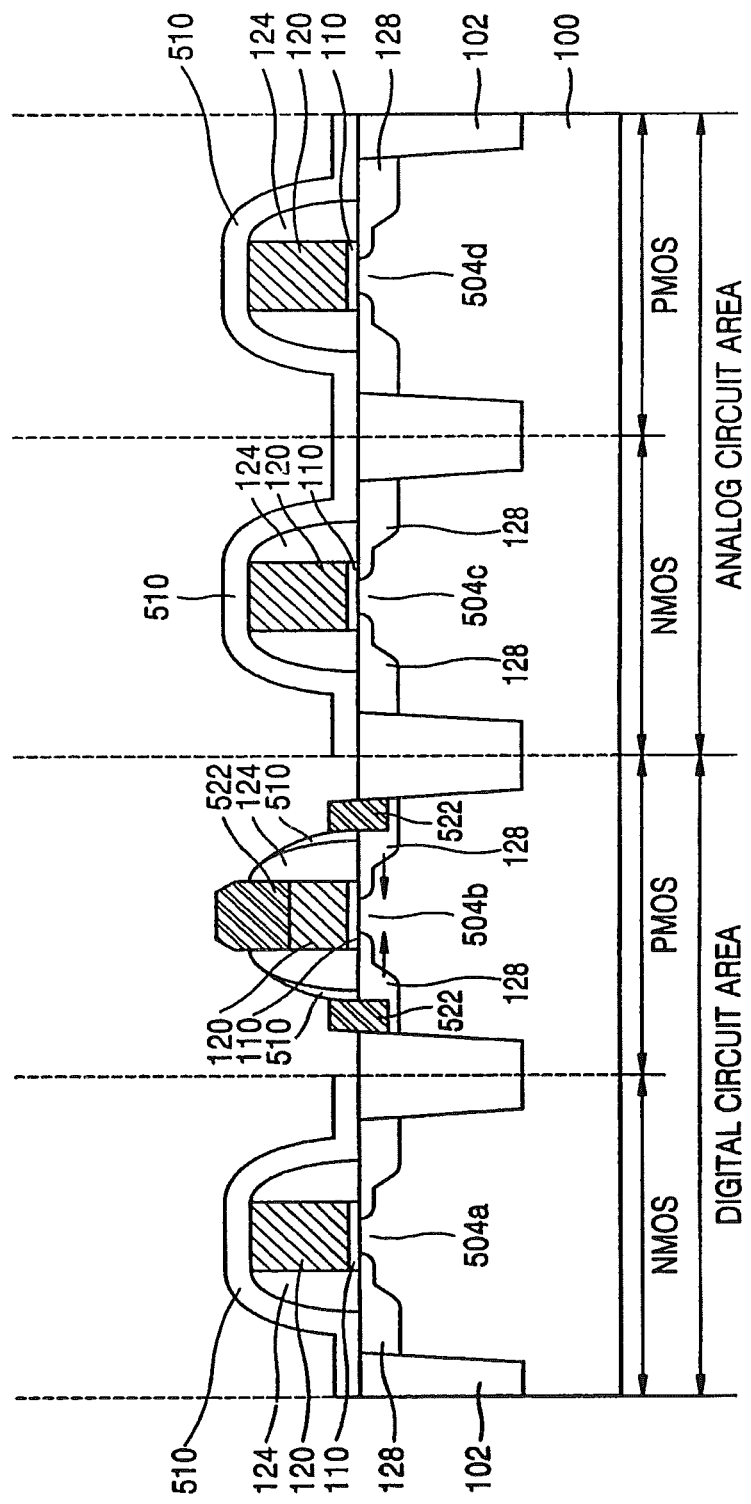

Referring to FIG. 24, a semiconductor layer 522 is selectively and epitaxially grown on the groove 520 and the top of the conductive gate 120. The epitaxial layer 522 can be SiGe, SiC, or other such material. The layer 522 imposes compressive stress on the channel 504b of the PMOS transistor in the digital circuit area, as indicated by the arrows in the figure. This compressive stress is due to the larger lattice constant of the epitaxially grown semiconductor layer 522. The material with the larger lattice constant exerts pressure on the material of the channel 504b, resulting in the compressive stress in the channel 504b. That is, the epitaxially grown semiconductor layer 522 and the substrate 100 have different crystal lattice structures and/or different thermal expansion coefficients, which produce a mechanical stress in the channel of the transistor, thereby affecting the mobility of carriers in the channel.

Figure 25:
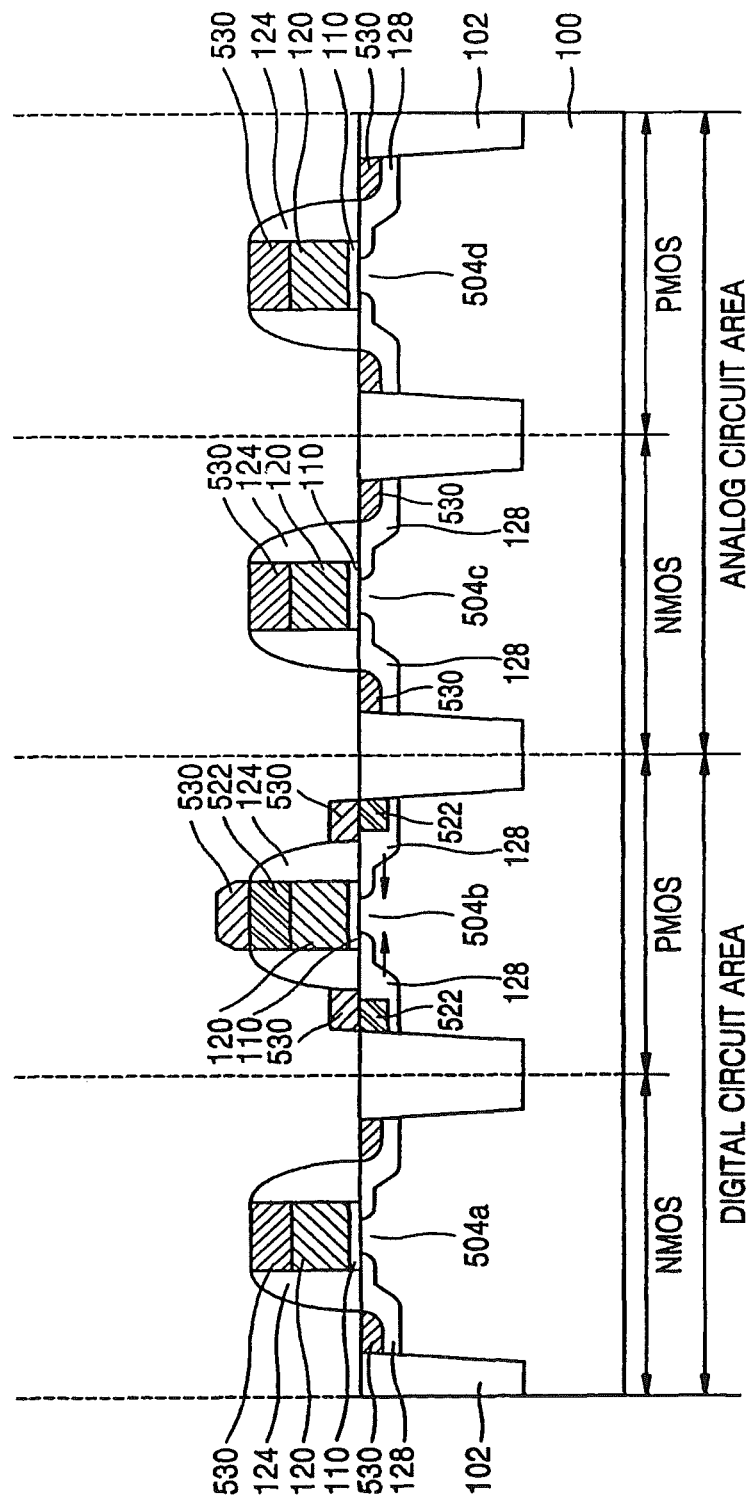

Referring to FIG. 25, the remainder of the mask layer 510 is removed from the structure. Then, metal silicide layers 530, which can be nickel silicide, cobalt silicide, or other similar material, are formed on the gate conductive patterns 120 and exposed source/drain regions 128, and on top of the epitaxially grown semiconductor layer 522 in the PMOS transistor in the digital circuit area.

Figure 26:
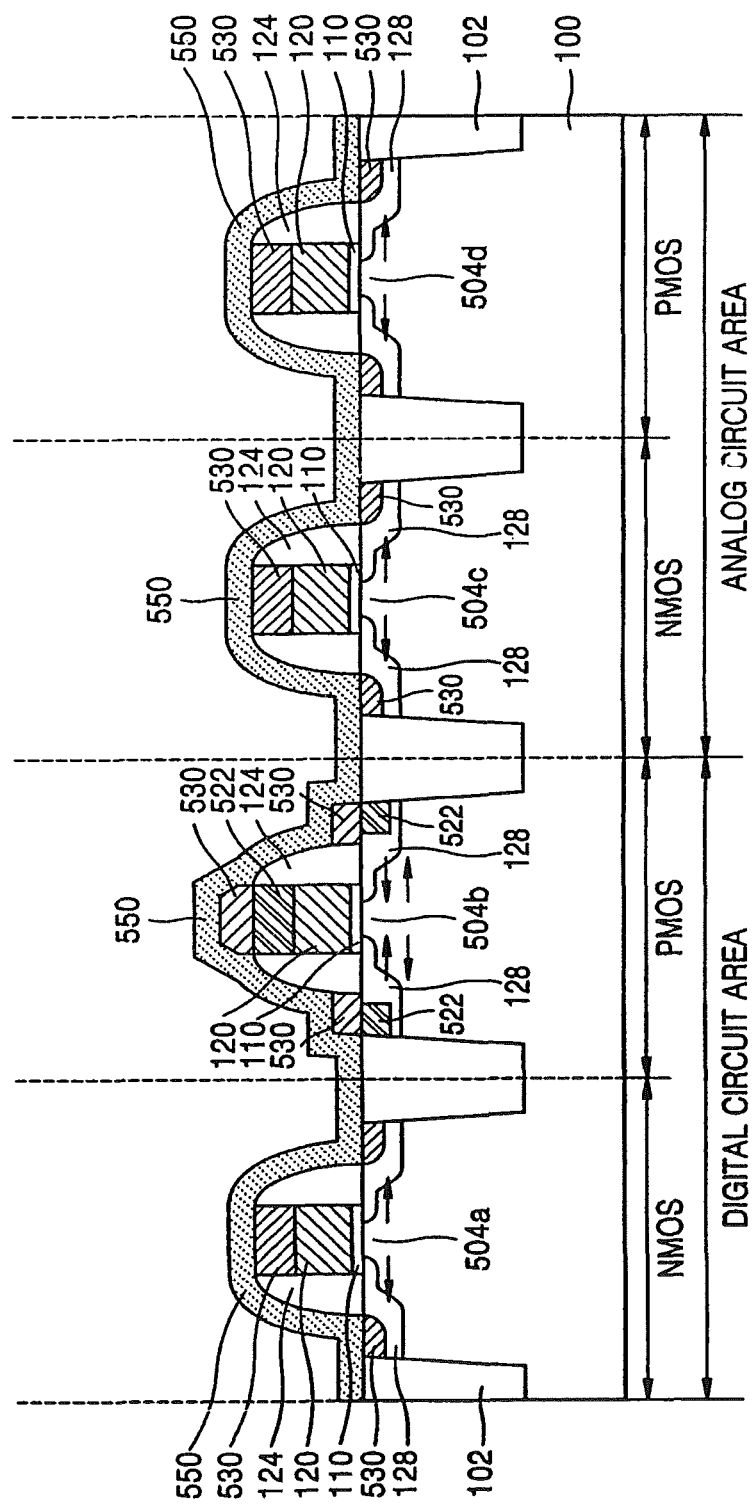

Next, referring to FIG. 26, a stress control layer 550, having a tensile stress, is formed on the structure. The stress control layer 550 can be a silicon nitride layer formed to a thickness of about 20-150 nm by LPCVD. The stress control layer 550 can be a silicon nitride layer formed under a high-temperature condition of 400-800 degrees C. Alternatively, the stress control layer 550 can be an annealed SiON layer formed by PECVD, or a tensile stress silicon oxide layer. As a result, tensile stress is locally imposed on the channels 504a, 504b, 504c, 504d.

Figure 27:
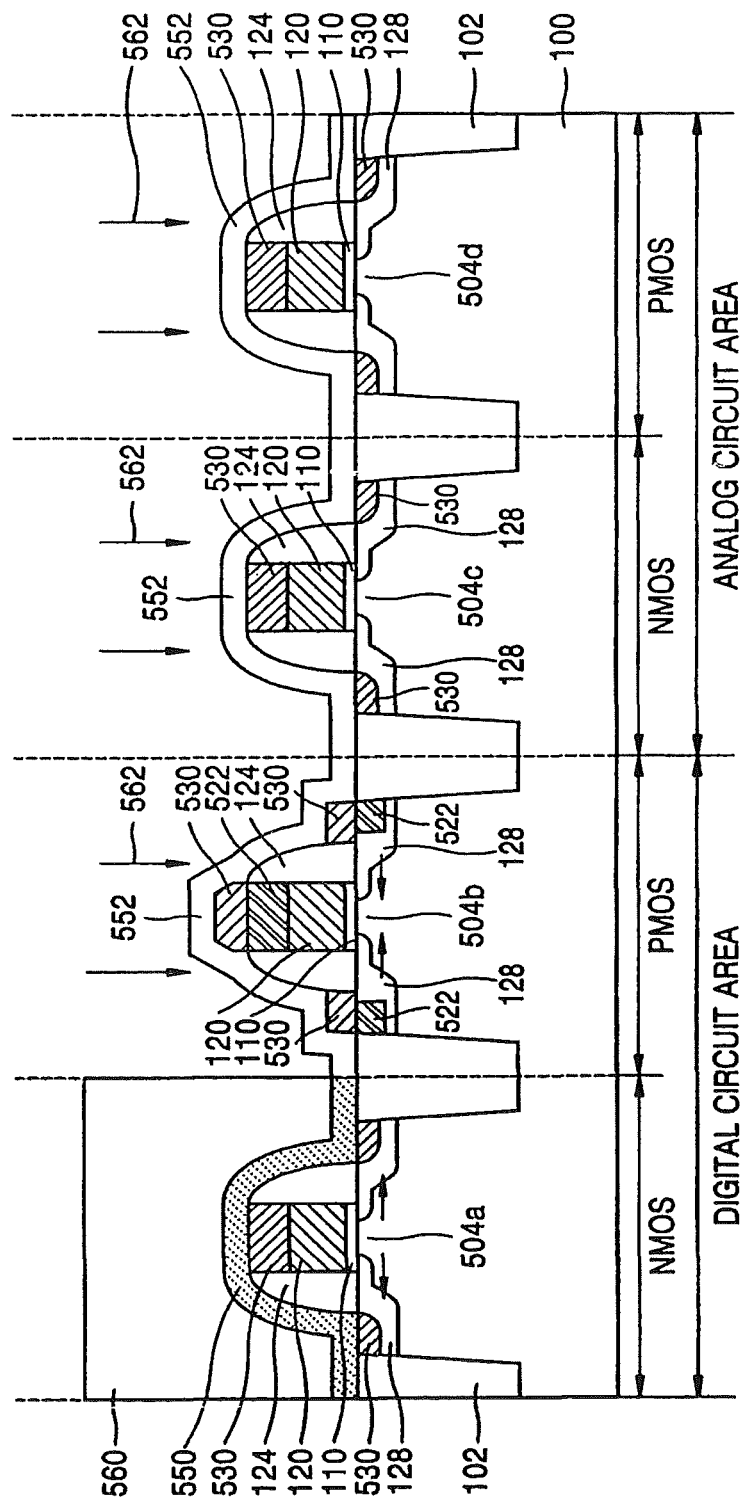

Next, referring to FIG. 27, the tensile stress is selectively released in the PMOS transistor in the digital circuit area and both of the transistors of the analog circuit area. A photoresist mask pattern 560 is formed over the NMOS transistor in the digital circuit area. Then, ions such as germanium, silicon, arsenic, indium, antimony, or other similar ions are implanted into the structure everywhere except in the NMOS transistor in the digital circuit area. As a result, the tensile stress is released in the PMOS transistor in the digital circuit area and in both transistors in the analog circuit area. After the ion implantation, tensile stress is locally imposed on the channel 504a of the NMOS transistor in the digital circuit area, and compressive stress is locally imposed in the channel 504b of the PMOS transistor in the digital circuit area, as indicated by the arrows in the figure. No net stress is imposed on the channels 504c and 504d of the transistors in the analog circuit area.

FIGS. 28 through 31 contain schematic cross-sectional views illustrating a method of forming a semiconductor device in accordance with another embodiment of the invention. This embodiment is of the type defined within the third category of embodiments described above. In this embodiment, a tensile and a compressive layer are separately formed to induce stress in both the NMOS and PMOS transistors in the digital circuit area. In the embodiment of FIGS. 28 through 31, the formation of the portion of the device including the substrate 100, STI 102, source/drain regions 128, gate dielectric patterns 110, conductive gate patterns 120, silicide patterns 130 and sidewall spacers 124 is the same as that of the embodiment of FIGS. 6 through 8. Accordingly, description thereof will not be repeated.

Figure 28:
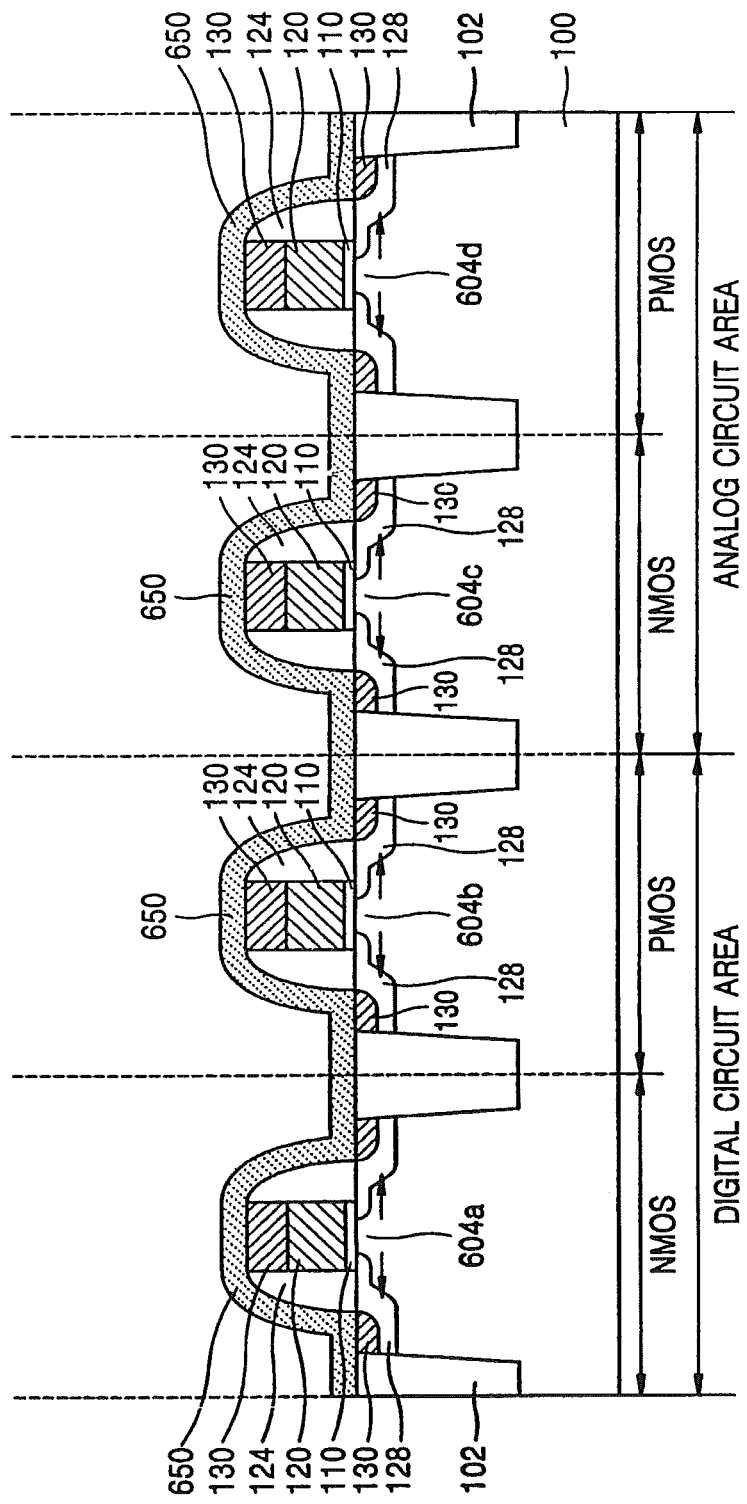
FIGS. 28 through 31 contain schematic cross-sectional views illustrating a method of forming a semiconductor device in accordance with another embodiment of the invention.

Referring to FIG. 28, a first stress control layer 650, which has a tensile stress, is formed over the structure. The first stress control layer 650 can be a silicon nitride layer formed to a thickness of about 20-150 nm by LPCVD. The layer 650 can be a silicon nitride layer formed under a high-temperature condition of 400-800 degrees C. Alternatively, the layer 650 can be an annealed SiON layer formed by PECVD, or a silicon oxide layer with tensile stress. As a result of formation of the first stress control layer, tensile stress is locally imposed on the channels 604a, 604b, 604c, 604d of the transistors in both the digital circuit area and the analog circuit area, as indicated by the arrows in the figure.

Figure 29:
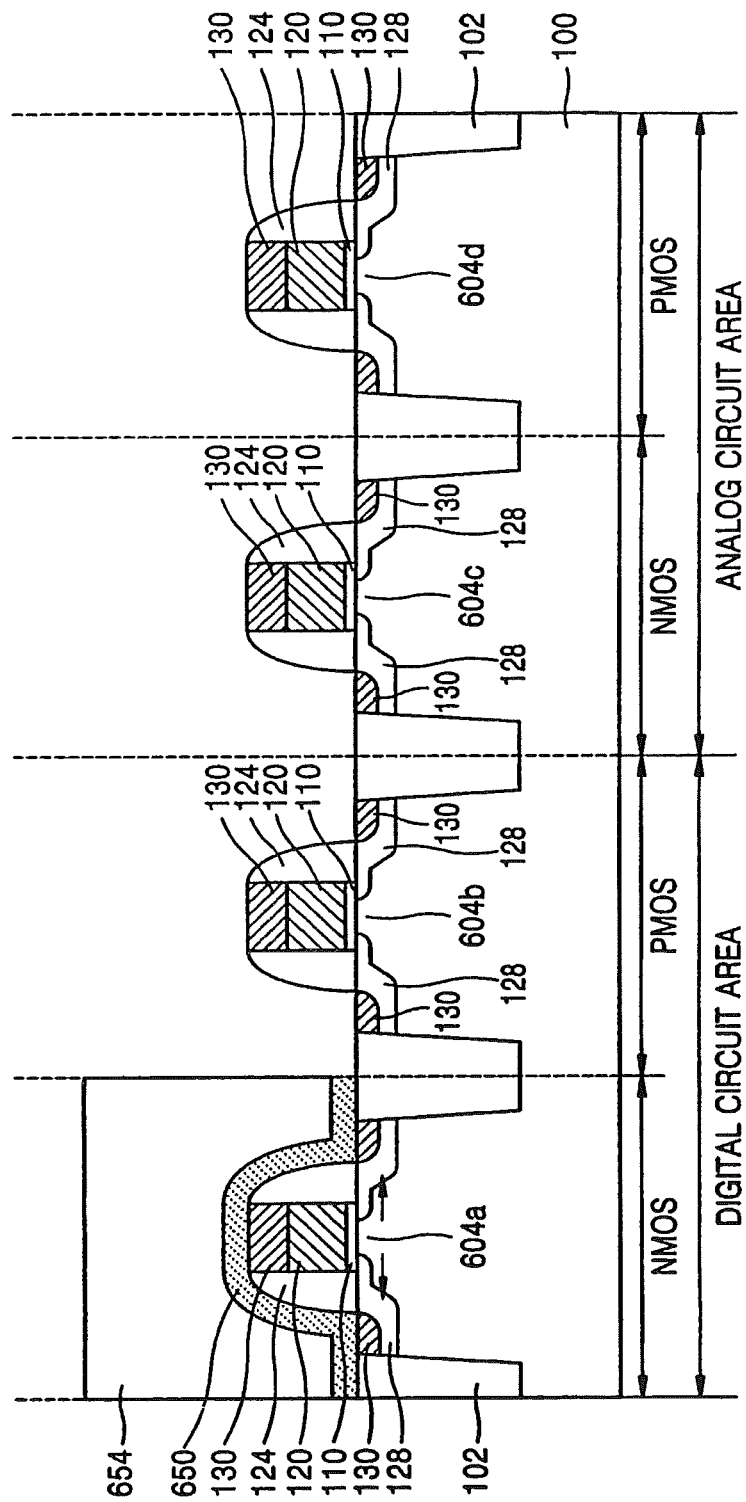

Referring to FIG. 29, the portion of the first stress control layer 650 over the PMOS transistor in the digital circuit area and over both transistors in the analog circuit area is removed. A photoresist pattern 654 is formed to cover only the NMOS transistor in the digital circuit area, and the exposed portion of the first stress control layer 650 is removed. It should be noted that if a PECVD SiON layer is used as the first stress control layer 650, then it is desirable that the annealing process be carried out after selectively removing the first stress control layer 650 from the PMOS transistor in the digital circuit area and the transistors in the analog circuit area. As a result of the selective removal of the first stress control layer 650, a tensile stress remains applied to only the channel 604a of the NMOS transistor in the digital circuit area, as shown by the arrows in the figure.

Figure 30:
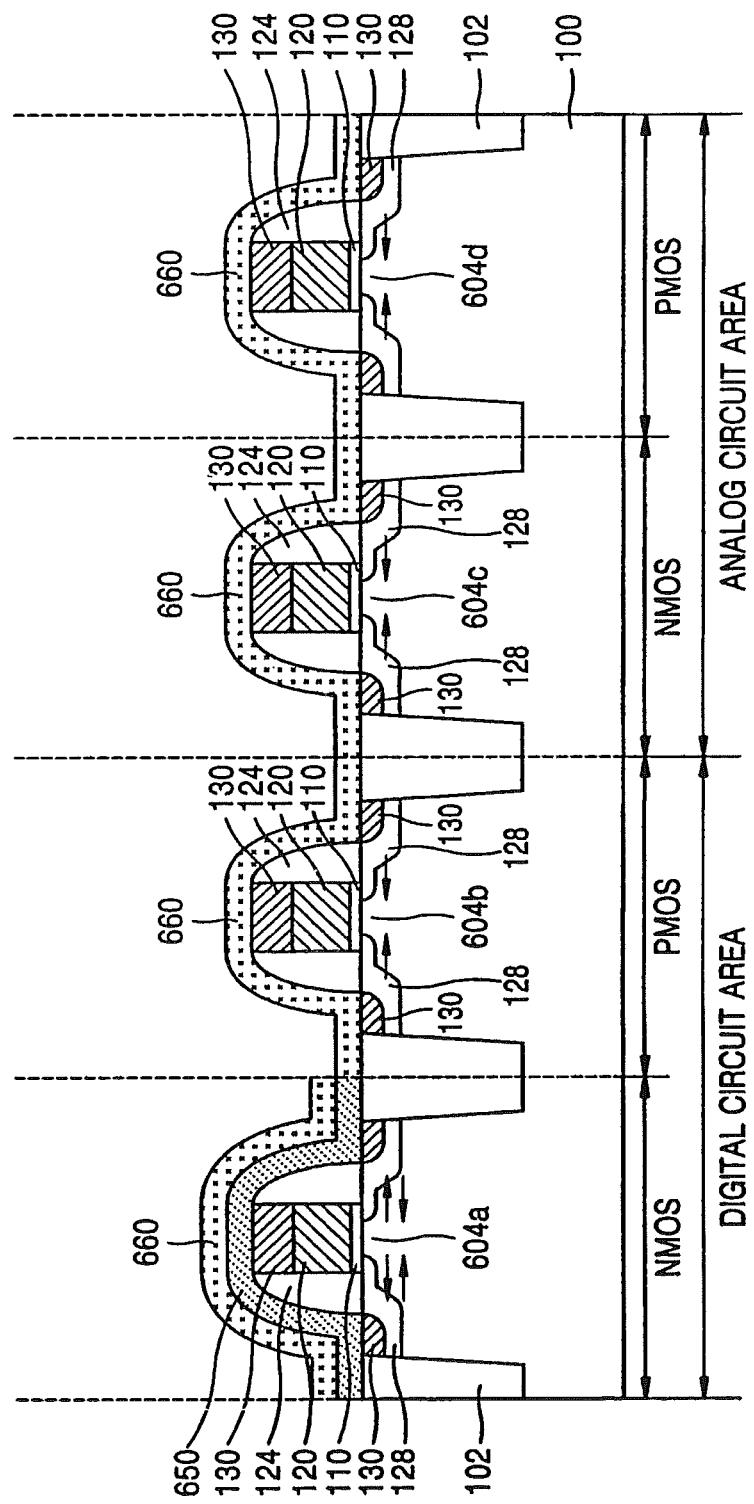

Referring to FIG. 30, a second stress control layer 660, which has a compressive stress, is formed over the structure. The second stress control layer 660 can be, for example, a layer of silicon nitride formed to a thickness of about 20-150 nm by PECVD. The second stress control layer 660 can be a silicon nitride layer formed under a low-temperature condition of 200-400 degrees C. The second stress control layer 660 can alternatively be a silicon oxide layer with a compressive stress. As a result of the formation of the second stress control layer 660, a compressive stress is applied to all of the channels 604a, 604b, 604c, 604d, and the channel 604a has both a compressive stress and a tensile stress applied, as shown by the arrows in the figure.

Figure 31:
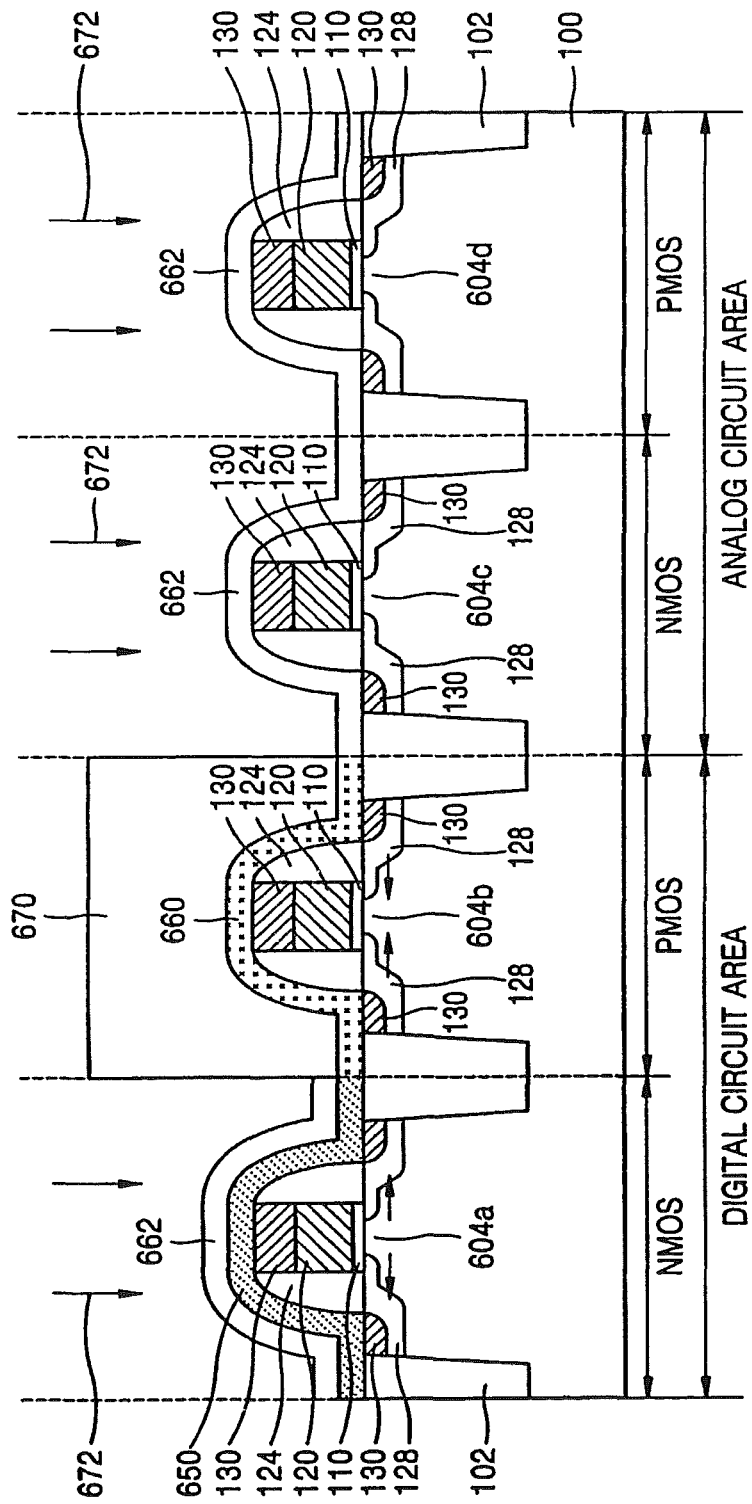

Referring to FIG. 31, the second stress control layer 660 is selectively converted to a stress release or relax layer 662 over all of the transistors except the PMOS transistor in the digital circuit area. A photoresist mask pattern 670 is formed over only the PMOS transistor in the digital circuit area. Ions such as germanium, silicon, arsenic, indium, antimony, or other similar ions, are implanted, indicated by 672, into the second stress control layer 660, except in the portion of the second stress control layer 660 that covers the PMOS transistor in the digital circuit area. The ion implantation releases the compressive stress in the exposed portion of the second stress control layer 660, such that the exposed portion of the second stress control layer becomes the stress release or relax layer 662. As a result, tensile stress is locally imposed only on the channel 604a of the NMOS transistor in the digital circuit area, and compressive stress is locally imposed only on the channel 604b of the PMOS transistor in the digital circuit area, as indicated by the arrows in the figure. Hence, performance of both the NMOS transistor and PMOS transistor in the digital circuit area is enhanced, while the transistors in the analog circuit area remain unaffected by applied stress, such that the transistors in the analog circuit area are not degraded by noise that may result from the application of stress on the transistors.

Figure 32:
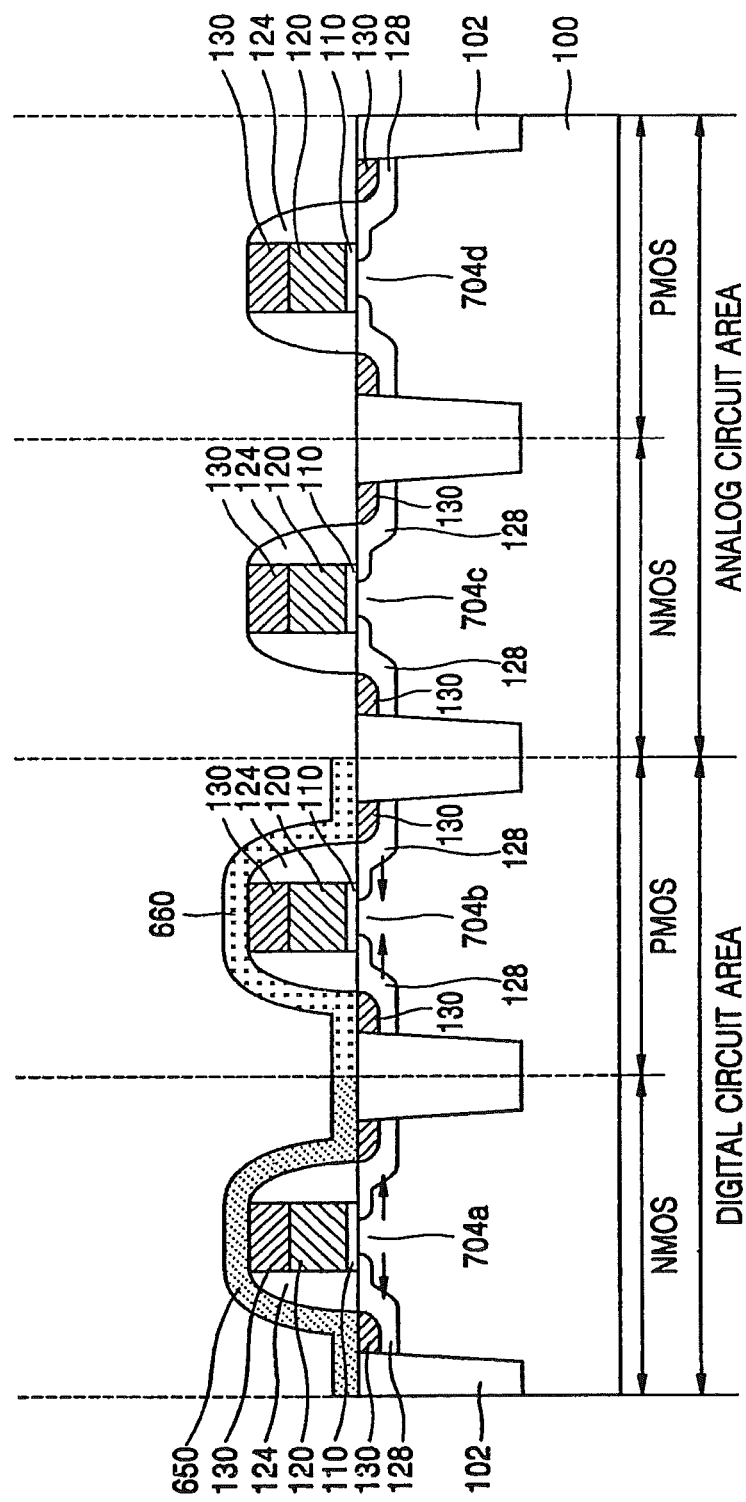
FIG. 32 contains a schematic cross-sectional view illustrating a method of forming a semiconductor device in accordance with another embodiment of the invention.

FIG. 32 contains a schematic cross-sectional views illustrating a method of forming a semiconductor device in accordance with another embodiment of the invention. This embodiment is of the type defined within the third category of embodiments described above. The embodiment of FIG. 32 is a variation of that of FIGS. 28 through 31. The steps shown in FIGS. 28 through 30 are also used in the embodiment of FIG. 32. Accordingly, description of those steps will not be repeated.

Referring to FIG. 32, after the second stress control layer 660 having a compressive stress is formed, the second stress control layer 660 is removed everywhere except over the PMOS transistor in the digital circuit area. As a result, tensile stress is locally imposed on the channel 704a of the NMOS transistor in the digital circuit area, and compressive stress is locally imposed on the channel 704b of the PMOS transistor in the digital circuit area, as indicated by the arrows in the figure.

Hence, in accordance with the invention, stress engineering is selectively applied to particular devices depending on their required operational configurations. That is, the appropriate stress, i.e., tensile or compressive, can be applied to and/or removed from devices, i.e., NMOS and/or PMOS devices, based not only on their conductivity type, i.e., n-type or p-type, but also on their intended operational application, for example, analog/digital, low-voltage/high-voltage, high-speed/low-speed, noise-sensitive/noise-insensitive, etc.

The present invention is applicable to circuits which include digital, analog and mixed-mode functions. For example, the invention is applicable to memory LSI, such as DRAM and embedded DRAM. The approach of the invention is applicable to the DRAM cell and/or the DRAM sense amplifier, which is considered to be a noise-sensitive analog circuit. The invention is applicable to other circuits such as the sense amplifier circuit of memory circuits in discrete memory chip or embedded memory chip configurations of, for example, SRAM, flash memory, MRAM, PRAM, and other such devices. The invention is particularly applicable to these circuits because the sense amplifiers in these circuits are required to sense very small differences in currents, and, therefore, noise such as flicker noise can substantially degrade their performance.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A semiconductor device comprising:
    a first transistor of an n-type conductivity in a first area of the semiconductor device;
    a second transistor of a p-type conductivity in the first area of the semiconductor device;
    a third transistor of an n-type conductivity in a second area of the semiconductor device;
    a fourth transistor of a p-type conductivity in the second area of the semiconductor device;
    a first stress control layer on the first transistor, wherein a first stress is applied to a channel of the first transistor by the first stress control layer; and
    a second stress control layer on the second transistor, wherein a second stress is applied to a channel of the second transistor by the second stress control layer and the second stress is not applied to a channel of the fourth transistor.

2. The semiconductor device of claim 1, wherein the first stress is a tensile stress and the second stress is a compressive stress.

3. The semiconductor device of claim 2, the first and second stress control layers comprise at least one of SiN and SiON.

4. The semiconductor device of claim 3, wherein the second stress control layer is absent on the fourth transistor.

5. The semiconductor device of claim 1, wherein the second stress is released in the fourth transistor by removing the second stress control layer.

6. The semiconductor device of claim 1, wherein the second transistor comprises a silicide layer on source and drain regions of the second transistor.

7. The semiconductor device of claim 6, wherein the silicide layer comprises a nickel silicide layer.

8. The semiconductor device of claim 7, further comprising a trench isolation in the first area to isolate the first and second transistors.

9. A semiconductor device comprising:
    a substrate;
    a first MOS device of a first conductivity type in a first area of the substrate;
    a second MOS device of the first conductivity type in a second area of the substrate; and
    a stress control layer on the first MOS device, wherein the stress control layer applies a stress to a channel of the first MOS device, and the stress is not applied to a channel of the second MOS device.

10. The semiconductor device of claim 9, wherein the stress control layer is absent on the second MOS device to which the stress is not applied.

11. The semiconductor device of claim 9, further comprising:
    a third MOS device of a second conductivity type in the first area of the substrate; and
    a fourth MOS device of the second conductivity type in the second area of the substrate.

12. The semiconductor device of claim 11, wherein the first conductivity type is p-type.

13. The semiconductor device of claim 12, wherein the second conductivity type is n-type.

14. The semiconductor device of claim 9, wherein the stress control layer comprises at least one of SiN and SiON.

15. The semiconductor device of claim 9, wherein the stress is a compressive stress.

* * * * *